United States Patent
Chung et al.

(10) Patent No.: US 11,453,823 B2
(45) Date of Patent: Sep. 27, 2022

(54) METHOD FOR MANUFACTURING TRANSFER FILM INCLUDING SEED LAYER, METHOD FOR MANUFACTURING CIRCUIT BOARD BY SELECTIVELY ETCHING SEED LAYER, AND ETCHING SOLUTION COMPOSITE

(71) Applicant: InkTec Co., Ltd., Ansan-si (KR)

(72) Inventors: Kwang-Choon Chung, Yongin-si (KR); Byung Woong Moon, Siheung-si (KR); Su Han Kim, Ansan-si (KR); Jae Rin Kim, Yongin-si (KR)

(73) Assignee: InkTec Co., Ltd., Ansan-si (KR)

( * ) Notice: Subject to any disclaimer, the term of this patent is extended or adjusted under 35 U.S.C. 154(b) by 551 days.

(21) Appl. No.: 16/487,104

(22) PCT Filed: Feb. 20, 2018

(86) PCT No.: PCT/KR2018/002074
§ 371 (c)(1),
(2) Date: Oct. 28, 2019

(87) PCT Pub. No.: WO2018/151578
PCT Pub. Date: Aug. 23, 2018

(65) Prior Publication Data
US 2020/0053881 A1 Feb. 13, 2020

(30) Foreign Application Priority Data

Feb. 20, 2017 (KR) .......................... 10-2017-0022586

(51) Int. Cl.
*C09K 13/00* (2006.01)
*C23F 1/00* (2006.01)
(Continued)

(52) U.S. Cl.
CPC ............... *C09K 13/00* (2013.01); *C23F 1/00* (2013.01); *C25D 3/38* (2013.01); *C25D 5/02* (2013.01);
(Continued)

(58) Field of Classification Search
CPC . C09K 13/00; C25D 3/38; C25D 5/02; C25D 5/10; H05K 1/09; H05K 3/067;
(Continued)

(56) References Cited

U.S. PATENT DOCUMENTS 4,357,395 A * 11/1982 Lifshin ................. H05K 3/384
205/186
6,777,108 B1 * 8/2004 Obata ...................... C25D 1/04
428/606

(Continued)

FOREIGN PATENT DOCUMENTS

CN          103384453         11/2013
GB          2 082 632 A   *   3/1982
(Continued)

OTHER PUBLICATIONS

International Search Report and the Written Opinion dated Jun. 7, 2018 From the International Searching Authority Re. Application No. PCT/KR2018/002074 and Its Translation of Search Report Into English. (16 Pages).

*Primary Examiner* — Carl J Arbes

(57) ABSTRACT

The disclosure relates to a method for manufacturing a transfer film including an electrode layer, the method comprising: an electrode layer formation step of forming an electrode layer on a carrier member by using a conductive material; a placement step of placing the carrier member on at least one side of an insulating resin layer respectively; a bonding step of bonding the carrier member and the insulating resin layer together by applying pressure thereto; and (Continued)

a transfer step of removing the carrier member to transfer the electrode layer on the insulating resin layer.

31 Claims, 13 Drawing Sheets

(51) Int. Cl.
  *C25D 3/38* (2006.01)
  *C25D 5/02* (2006.01)
  *H05K 1/09* (2006.01)
  *H05K 3/06* (2006.01)
  *H05K 3/42* (2006.01)
  *H05K 3/46* (2006.01)
  *C25D 5/10* (2006.01)

(52) U.S. Cl.
  CPC .............. *C25D 5/10* (2013.01); *H05K 1/09* (2013.01); *H05K 3/067* (2013.01); *H05K 3/423* (2013.01); *H05K 3/425* (2013.01); *H05K 3/429* (2013.01); *H05K 3/4652* (2013.01); *H05K 2203/072* (2013.01); *H05K 2203/0723* (2013.01); *H05K 2203/0793* (2013.01); *H05K 2203/0796* (2013.01)

(58) Field of Classification Search
  CPC ........ H05K 3/423; H05K 3/425; H05K 3/429; H05K 3/4652; H05K 2203/072; H05K 2203/0723; H05K 2203/0793; H05K 2203/0795
  See application file for complete search history.

(56) References Cited

U.S. PATENT DOCUMENTS

| | | | |
|---|---|---|---|
| 7,927,454 B2 * | 4/2011 | Huynh | ................ C23C 18/1612 |
| | | | 156/290 |
| 9,526,169 B2 * | 12/2016 | Ha | ............................ H05K 1/11 |
| 9,982,348 B2 * | 5/2018 | Liao | .................... C23C 18/1657 |
| 10,257,938 B2 * | 4/2019 | Kohiki | .................. C25D 5/605 |
| 2020/0053881 A1 | 2/2020 | Chung et al. | |

FOREIGN PATENT DOCUMENTS

| | | | |
|---|---|---|---|
| JP | 09296156 A | * | 11/1997 |
| JP | 2001-068804 A | * | 10/2001 |
| JP | 2004230729 A | * | 8/2004 |
| JP | 2006-156930 | | 6/2006 |
| JP | 2010222657 A | * | 10/2010 |
| JP | 2014046600 A | * | 3/2014 |
| KR | 10-2010-0041980 | | 4/2010 |
| KR | 1020100041980 | * | 4/2010 |
| KR | 10-2010-0053983 | | 5/2010 |
| KR | 101044790 B1 | * | 6/2011 |
| KR | 10-2012-0076198 | | 7/2012 |
| KR | 1020130130515 A | * | 12/2013 |
| KR | 10-2016-0064466 | | 6/2016 |
| KR | 2016-0065628 | | 6/2016 |
| KR | 101630435 B1 | * | 6/2016 |
| WO | WO 2018/151578 | | 8/2018 |

* cited by examiner

FIG. 2
S11
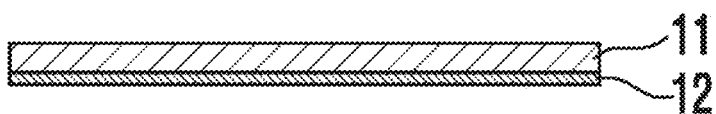
S12
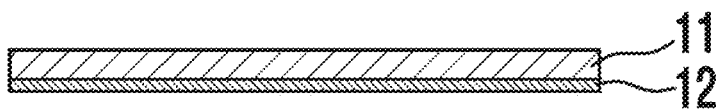
S13
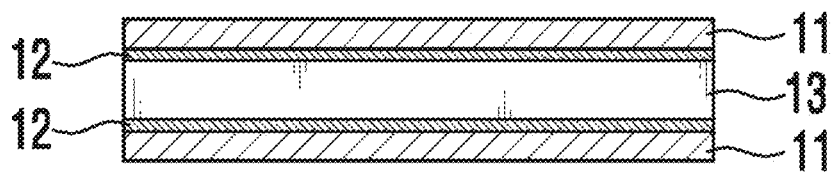
S14
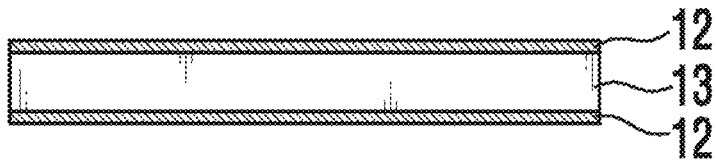

FIG. 4
S21 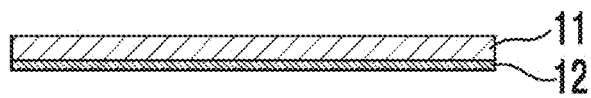
S22 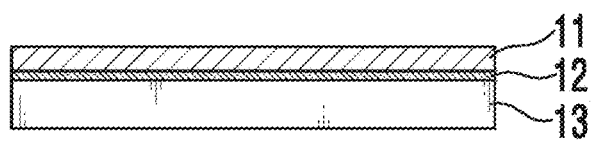
S23 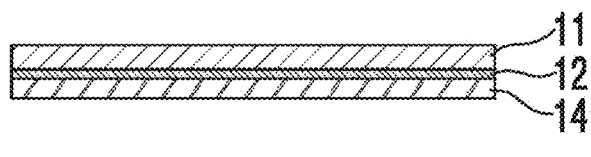
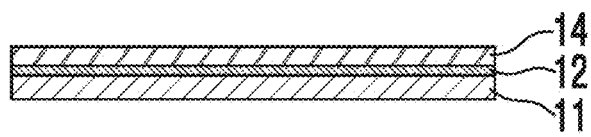
S24 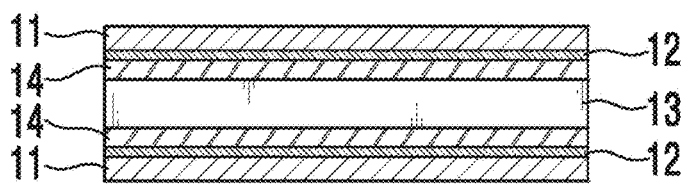
S25 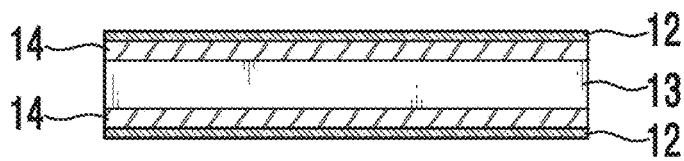

FIG. 5
S111
(a)
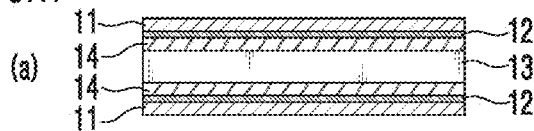
S112
(b)
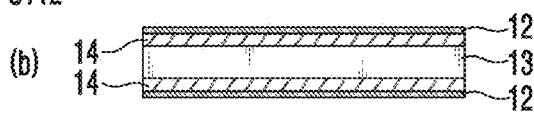
S113
(c)
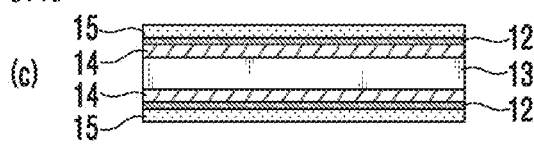
S114
(d)
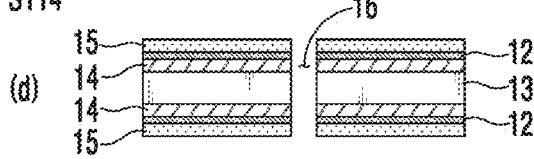
S115
(e)
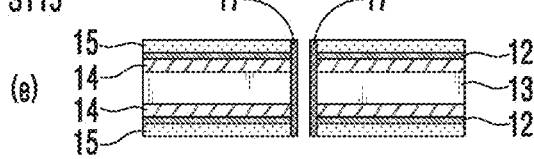
S116
(f)
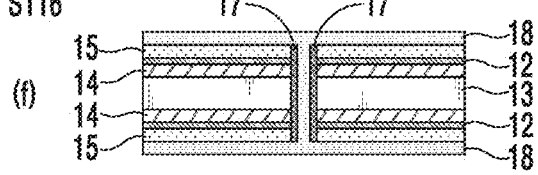
S117
(g)
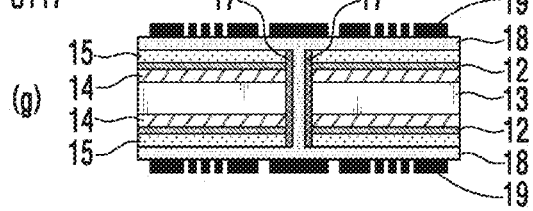
S118
(h)
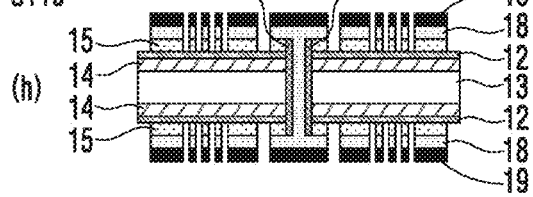
S119
(i)
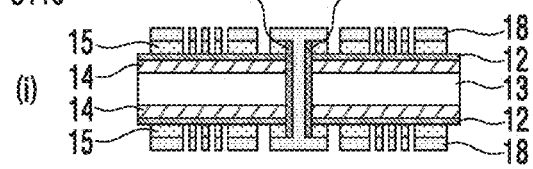
S120
(j)
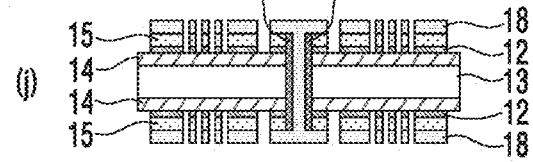

FIG. 13

| | ICP (ppm) | | | |
|---|---|---|---|---|
| | Ag | | Cu | |
| SELECTIVE ETCHING SOLUTION COMPOSITION 1 | 177.4 | | N.D | |
| SELECTIVE ETCHING SOLUTION COMPOSITION 2 | 173.5 | | N.D | |
| SELECTIVE ETCHING SOLUTION COMPOSITION 3 | 176.1 | | N.D | |
| COMPARATIVE EXAMPLE 1 | 147.2 | | 524.0 | |
| COMPARATIVE EXAMPLE 2 | 139.5 | | 255.4 | |
| COMPARATIVE EXAMPLE 3 | 171.3 | | 2,437 | |

METHOD FOR MANUFACTURING TRANSFER FILM INCLUDING SEED LAYER, METHOD FOR MANUFACTURING CIRCUIT BOARD BY SELECTIVELY ETCHING SEED LAYER, AND ETCHING SOLUTION COMPOSITE

RELATED APPLICATIONS

This application is a National Phase of PCT Patent Application No. PCT/KR2018/002074 having International filing date of Feb. 20, 2018, which claims the benefit of priority of Korean Patent Application No. 10-2017-0022586 filed on Feb. 20, 2017. The contents of the above applications are all incorporated by reference as if fully set forth herein in their entirety.

FIELD AND BACKGROUND OF THE INVENTION

The present invention relates to a method of manufacturing a transfer film including a seed layer, and more particularly to a method of manufacturing a transfer film including a seed layer, in which the seed layer for forming a circuit is provided without using a copper clad film.

In general, a printed circuit board refers to an electronic part given in a form of a board on which various electronic parts are mounted and electrically connected.

There are various kinds of printed circuit board, such as a single-layer type, a double-sided type, a multi-layered type, etc. according to a circuit pattern layer of a wiring structure. In the beginning of using the printed circuit board, a relatively simple structure or the like where printing wiring is formed on a single side was mainly applied to a product. However, an electronic product has gradually become lightweight and compact and has had multi and complex functions, thereby evolving into a multi-layered product of the double-sided type, the multi-layered type, etc. with high wiring density and a complicated structure.

To describe a usual method of manufacturing the double-sided printed circuit board among such printed circuit boards, a double-sided flexible printed circuit board will be described by way of example.

A double-sided copper clad laminate (CCL) film material that thin films of copper (Cu) are layered on both sides of an insulating film such as a polyimide film or a polyester film is prepared, and then the CCL film is drilled at a predetermined position to form a via hole through which portions on the copper (Cu) layers are electrically connected to form a circuit pattern. Then, the via hole is plated to electrically connect the copper (Cu) layers. Next, a photosensitive film is used for or a solution is applied to the both copper (Cu) layers of the CCL film, and therefore each of the copper (Cu) layers is subjected to exposure, development, etching, and stripping to have a predetermined circuit pattern, thereby manufacturing the double-sided flexible circuit board.

However, such a conventional manufacturing method needs to use an expensive copper clad film and thus has a problem of raising costs. In particular, it is difficult to finely form an inner layer circuit when a high multi-layered printed circuit board is manufactured.

Meanwhile, as a conventional method of forming a circuit, a lithography process, in which a photocurable resin is used in exposure and etching to form a pattern, has mostly been used. The lithography process refers to a method of manufacturing a copper circuit board by forming a desired pattern with the photocurable resin on a substrate material having a copper plating layer and applying the exposure and the etching. However, the minimum pitch achievable by such a lithography process is 35 μm, and it is therefore difficult to form a fine pattern.

Due to such difficulty on the process, a semi additive process (SAP) method has recently been used as a technique for achieving the fine pitch. By sputtering, chemical vapor deposition (CVD), electroless plating and compression, a pattern is formed with the photocurable resin on the substrate material onto which a metal seed layer is thinly applied, and the photocurable resin is removed after a pattern groove formed as above is plated with a conductive material such as copper, etc. After the circuit is formed based on copper plating and then the photocurable resin is removed, the metal seed layer is removed, thereby forming a circuit having a fine pitch.

However, a copper-foil stacked substrate, to which the SAP method is applicable, is capable of achieving a fine pitch, but has a poor adhesive property because the seed layer is formed on a film unlike the existing two-layered and three-layered copper-foil stacked substrates. Further, the seed layer is made of copper; or metal such as chrome (Cr), nickel (NI), etc. a metal alloy or a metal compound to be etched along with copper, and therefore a circuit forming portion made of copper is also etched together with the seed layer as shown in FIG. 9 while the seed layer is etched after removing the photocurable resin, thereby causing a nonuniform thickness and a nonuniform linewidth.

Besides, when the seed layer is not completely removed, it leads to a defective product because of migration.

As a method that has been hitherto used for etching a metal wiring or thin film, the most common method is classified into a plasma process and a method of using an etching solution. In the case of using the etching solution, the etching solution generally contains phosphoric acid, nitric acid, acetic acid, hydrochloric acid, sulfuric acid, ammonia, iron phosphate, iron nitrate, iron sulfate, iron hydrochloride, sodium chlorate, and water, and therefore etches not only silver but also other metals, a metal alloy or a metal compound, thereby damaging a metal circuit layer. Thus, there has been a problem of forming a poor pattern of which an etch factor is low.

SUMMARY OF THE INVENTION

Accordingly, the present invention is conceived to solve such conventional problems, and an aspect of the present invention is to provide a method of manufacturing a transfer film including a seed layer, in which the seed layer for forming a circuit is provided without using a copper clad film.

Further, an aspect of the present invention is to provide a method of manufacturing a transfer film including a seed layer, in which a rough film having low surface smoothness is used to form an insulating resin layer, preventing the surface smoothness of the seed layer from being lowered.

An aspect of the present invention is to provide a method of manufacturing a circuit board by selectively etching a seed layer, in which the seed layer having high smoothness is provided to secure high smoothness of a plating layer to be formed on the seed layer, thereby forming a precise circuit pattern.

Further, an aspect of the present invention is to provide a method of manufacturing a circuit board by selectively etching a seed layer, in which the surface roughness of the seed layer is so low that diffuse reflection from the surface of the seed layer can be more suppressed than that from a copper plating layer during an exposure process for forming a pattern layer on the seed layer, thereby forming a relatively precise pattern groove and thus forming a fine circuit.

Accordingly, an aspect of the present invention is to provide a method of manufacturing a circuit board by selectively etching a seed layer, in which a pattern is formed by a wet process or a semi additive process (SAP) process using a transfer film with a thin seed layer formed through sputtering, chemical vapor deposition (CVD), electroless plating, coating, dipping, and the like process employing silver excellent in electric conductivity, a silver alloy or a silver compound instead of copper, and then only silver, the silver alloy or the silver compound is selectively etched to form the circuit.

Further, an aspect of the present invention is to provide an etching solution composition, with which only silver, a silver alloy or a silver compound is selectively etched minimizing removal of a metal circuit layer, thereby having a high etch factor and preventing a metal circuit layer from damage.

The foregoing aspects of the present invention are achieved by providing a method of manufacturing a transfer film comprising a seed layer, the method comprising: a seed-layer forming step of forming a seed layer with a first conductive material on a carrier member; a placing step of placing the seed layer on at least one side of an insulating resin layer; a bonding step of pressing and bonding the seed layer and the insulating resin layer in a thickness direction; and a transfer step of removing the carrier member to transfer the seed layer to the insulating resin layer.

Here, the carrier member may comprise a smooth surface.

Further, the first conductive material may comprise silver (Ag), a silver alloy, or a silver compound.

Further, the insulating resin layer may comprise a prepreg sheet, a bonding sheet, or a hot-melt thermosetting resin.

Further, the bonding step may comprise performing a hot-press process to bond the insulating resin layer to the seed layer.

Further, bonding force between the carrier member and the seed layer is weaker than bonding force between the insulating resin layer and the seed layer.

Further, a thermosetting-resin layer forming step of forming a thermosetting resin layer on the seed layer may be performed before the placing step.

Further, the thermosetting resin layer is applied as uncured onto the seed layer without being cured, and then cured in the bonding step.

Further, bonding force between the carrier member and the seed layer may be weaker than bonding force between the thermosetting resin layer and the seed layer.

The foregoing aspects of the present invention are achieved by providing a method of manufacturing a circuit board by selectively etching a seed layer, the method comprising: a transfer-film preparing step of preparing a transfer film in which a seed layer of silver (Ag) and a carrier member are stacked on an insulating resin layer; a carrier-member removing step of stripping the carrier member from the transfer film to expose the seed layer; a circuit-pattern forming step of forming a circuit pattern of copper (Cu) on the seed layer; and a seed-layer etching step of removing the seed layer exposed through the circuit pattern.

Here, the seed-layer etching step may comprise using a selective etching solution capable of dissolving only the seed layer of silver to selectively remove the seed layer.

Further, the method may further comprise, after the carrier-member removing step: a first plating-layer forming step of forming a first plating layer of copper (Cu) on a seed layer formed on each side of the insulating resin layer; a via-hole forming step of forming a via hole to penetrate from the first plating layer of one side to the first plating layer of the other side; and a current-carrying portion forming step of forming a current carrying portion of copper on an inner wall of the via hole.

Further, the method may further comprise, after the seed-layer etching step: a transfer-film bonding step of disposing the insulating resin layer and the carrier member formed with the seed layer of silver (Ag) in sequence on the circuit pattern, and pressing and bonding the seed layer and the insulating resin layer in a thickness direction; a transfer step of removing the carrier member to transfer the seed layer to the insulating resin layer; and a circuit-pattern forming step of forming a circuit pattern of copper (Cu) on the seed layer.

Further, the method may further comprise, after the transfer step: a first plating-layer forming step of forming a first plating layer of copper (Cu) on the seed layer; a via-hole forming step of forming a via hole to penetrate the first plating layer, the seed layer, and the insulating resin layer and expose a circuit pattern beneath the insulating resin layer; and a current-carrying portion forming step of forming a current carrying portion of copper on an inner wall of the via hole.

Further, the circuit-pattern forming step may comprise: a second plating-layer forming step of forming a second plating layer of copper on surfaces of the first plating layer and the current carrying portion; a pattern-layer forming step of forming a pattern layer on the second plating layer to selectively expose the second plating layer; a plating-layer etching step of forming a circuit pattern by etching the first and second plating layers of copper exposed through the pattern layer; and a pattern-layer removing step of removing the pattern layer.

The foregoing aspects of the present invention are achieved by providing a method of manufacturing a circuit board by selectively etching a seed layer, the method comprising: a transfer-film preparing step of preparing a transfer film in which a seed layer of silver and a carrier member are stacked on each side of an insulating resin layer; a carrier-member removing step of stripping the carrier member from the transfer film to expose the seed layer; a circuit-pattern forming step of forming a circuit pattern of copper on the seed layer; and a seed-layer etching step of removing the seed layer exposed through the circuit pattern.

Here, the seed-layer etching step may comprise using a selective etching solution capable of dissolving only the seed layer of silver to selectively remove the seed layer.

Further, the method may further comprise, after the transfer-film preparing step: a via-hole forming step of forming a via hole to penetrate the transfer film in a thickness direction; and a current-carrying portion forming step of forming a current carrying portion of copper on an inner wall of the via hole.

Further, the method may further comprise, after the seed-layer etching step: a bonding step of disposing the insulating resin layer and the carrier member formed with the seed layer of silver (Ag) in sequence on the circuit pattern, and pressing and bonding the seed layer and the insulating resin layer in a thickness direction; and a transfer step of removing the carrier member to transfer the seed layer to the insulating resin layer.

Further, the method may further comprise, after the transfer step, a circuit-pattern forming step of forming a circuit pattern of copper (Cu) on the seed layer.

Further, the method may further comprise, after the bonding step: a via-hole forming step of forming a via hole to penetrate the carrier member, the seed layer, and the insulating resin layer and expose the circuit pattern beneath the insulating resin layer; and a current-carrying portion forming step of forming a current carrying portion of copper on an inner wall of the via hole.

Further, the circuit-pattern forming step may comprise: pattern-layer forming step of forming a pattern layer on the seed layer to selectively expose the seed layer; a first plating-layer forming step of forming a first plating layer of copper on surfaces of the seed layer and the current carrying portion exposed through the pattern layer; and a pattern-layer removing step of removing the pattern layer.

Further, the selective etching solution may comprise an oxidizing agent; amines or an ammonium compound; an additive; and water.

Further, the selective etching solution may comprise 1 to 30 wt % of oxidizing agent, 1 to 75 wt % of amine or ammonium compound, 0.1 to 10 wt % of additive, and a remaining wt % of water with respect to a total 100 wt % of the selective etching solution.

Further, the oxidizing agent may comprise one or more selected from a group consisting of oxidative gas, peroxides, peroxy acid, and potassium persulfate.

Further, the oxidative gas may comprise one or more selected from a group consisting of air, oxygen, and ozone; the peroxide may comprise one or more selected from a group consisting of sodium perborate, hydrogen peroxide, sodium bismuthate, sodium percarbonate, benzoyl peroxide, potassium peroxide, and sodium peroxide; and the peroxy acid may comprise one or more selected from a group consisting of formic acid, peroxyacetic acid, perbenzoic acid, 3-chloroperoxybenzoic acid, and trimethylacetic acid.

Further, the amines may comprise one or more selected from a group consisting of an aliphatic amine, an aromatic amine, and an alkanol amine.

Further, the amines or ammonium compound may comprise one or more selected from a group consisting of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethnaolamine, 1-aminoethanol, 2-amino-2-methyl-1-propanol, ammonium carbonate, ammonium phosphate, ammonium nitrate, ammonium fluoride, and ammonium hydroxide.

Further, the additive may comprise one or more selected from a group consisting of a chelate agent, an antifoaming agent, a wetting agent, and a pH regulator.

The foregoing aspects of the present invention are achieved by providing an etching solution composition for selectively etching the seed layer of silver, comprising an oxidizing agent; amines or an ammonium compound; an additive; and water.

Here, the selective etching solution composition may comprise 1 to 30 wt % of oxidizing agent, 1 to 75 wt % of amine or ammonium compound, 0.1 to 10 wt % of additive, and a remaining wt % of water with respect to a total 100 wt % of the selective etching solution.

Further, the oxidizing agent may comprise one or more selected from a group consisting of oxidative gas, peroxides, peroxy acid, and potassium persulfate.

Further, the oxidative gas may comprise one or more selected from a group consisting of air, oxygen, and ozone; the peroxide may comprise one or more selected from a group consisting of sodium perborate, hydrogen peroxide, sodium bismuthate, sodium percarbonate, benzoyl peroxide, potassium peroxide, and sodium peroxide; and the peroxy acid may comprise one or more selected from a group consisting of formic acid, peroxyacetic acid, perbenzoic acid, 3-chloroperoxybenzoic acid, and trimethylacetic acid.

Further, the amines may comprise one or more selected from a group consisting of an aliphatic amine, an aromatic amine, and an alkanol amine.

Further, the amines or ammonium compound may comprise one or more selected from a group consisting of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethnaolamine, 1-aminoethanol, 2-amino-2-methyl-1-propanol, ammonium carbonate, ammonium phosphate, ammonium nitrate, ammonium fluoride, and ammonium hydroxide.

Further, the additive may comprise one or more selected from a group consisting of a chelate agent, an antifoaming agent, a wetting agent, and a pH regulator.

Advantageous Effects

According to the present invention, there is provided a method of manufacturing a transfer film including a seed layer, in which the seed layer for forming a circuit is provided without using a copper clad film.

Further, there is provided a method of manufacturing a transfer film including a seed layer, in which a thermosetting resin layer is interposed between the seed layer and an insulating resin layer, so that a rough film having low surface smoothness can be used to form an insulating resin layer, preventing the surface smoothness of the seed layer from being lowered.

According to the present invention, there is provided a method of manufacturing a circuit board by selectively etching a seed layer, in which the seed layer having high smoothness is provided to secure high smoothness of a plating layer to be formed on the seed layer, thereby forming a precise circuit pattern.

According to the present invention, there is provided a method of manufacturing a circuit board by selectively etching a seed layer, in which the surface roughness of the seed layer is so low that diffuse reflection from the surface of the seed layer can be more suppressed than that from a copper plating layer during an exposure process for forming a pattern layer on the seed layer, thereby forming a relatively precise pattern groove and thus forming a fine circuit.

Further, according to the present invention, there is provided an etching solution composition having a high etch factor so that silver, a silver alloy or a silver compound can be selectively etched without damaging a copper circuit.

These make it possible to design a high-performance and highly-integrated circuit, and the circuit is variously applicable to a product required to be lightweight, thin, short and compact.

BRIEF DESCRIPTION OF THE SEVERAL VIEWS OF THE DRAWINGS

FIG. 2 is a cross-sectional view corresponding to process steps in the method of manufacturing the transfer film including the seed layer according to the first embodiment of the present invention FIG. 4 is a cross-sectional view corresponding to process steps in the method of manufacturing the transfer film including the seed layer according to the second embodiment of the present invention, FIG. 5 is a cross-sectional view corresponding to process steps in a method of manufacturing a circuit board by selectively etching a seed layer according to a third embodiment of the present invention, FIG. 13 is an etching test table of etching solution compositions according to the present invention and comparative examples.

DESCRIPTION OF SPECIFIC EMBODIMENTS OF THE INVENTION

Prior to description, throughout embodiments, elements having equivalent configurations will be representatively described with like numerals in a first embodiment, and elements different from those of the first embodiment will be described in the other embodiments.

Hereinafter, a method of manufacturing a transfer film including a seed layer according to the first embodiment of the present invention will be described in detail with reference to the accompanying drawings.

Figure 1:
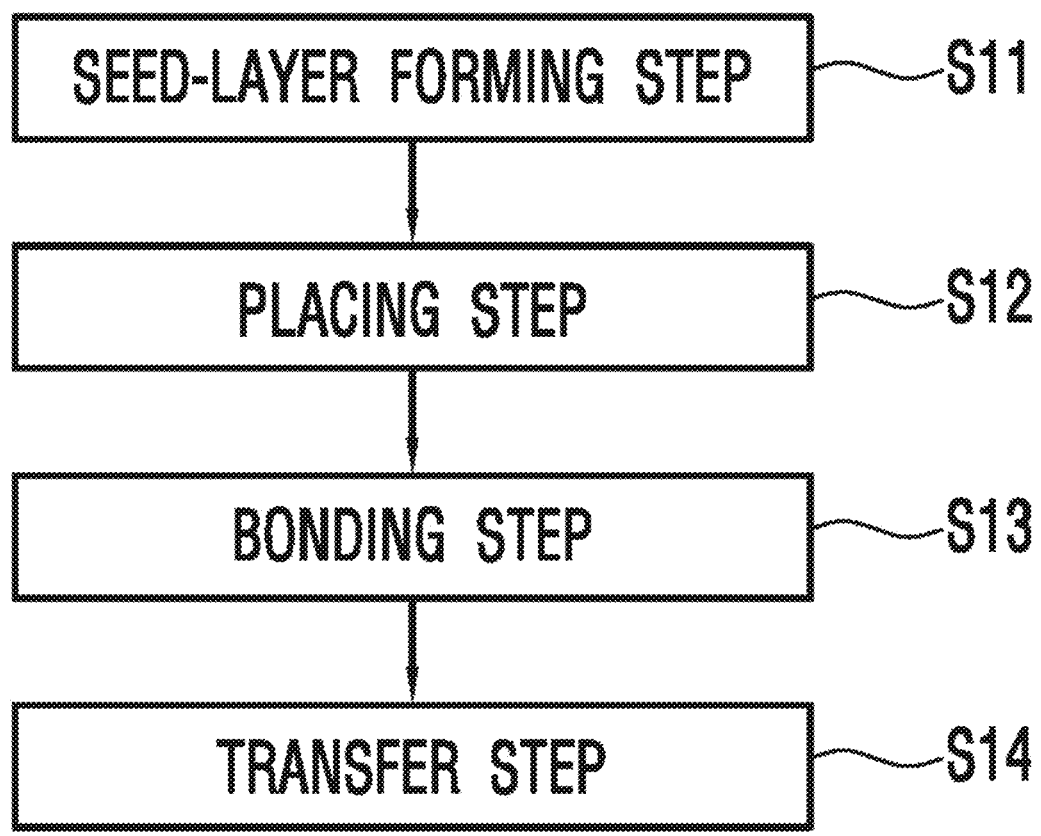
FIG. 1 is a flowchart showing a method of manufacturing a transfer film including a seed layer according to a first embodiment of the present invention.

Among the accompanying drawings, FIG. 1 is a flowchart showing a method of manufacturing a transfer film including a seed layer according to a first embodiment of the present invention, and FIG. 2 is a cross-sectional view corresponding to process steps according to the first embodiment of the present invention.

As shown in FIGS. 1 and 2, the method of manufacturing the transfer film including the seed layer according to the first embodiment of the present invention includes a seed-layer forming step S11 of using a conductive material to form a seed layer 12 on a carrier member 11; a placing step S12 of placing the carrier member 11 at least one side of an insulating resin layer 13; a bonding step S13 of pressing and bonding the carrier member 11 and the insulating resin layer 13; and a transfer step S14 of removing the carrier member 11 and transferring the seed layer 12 to the insulating resin layer 13.

In the seed-layer forming step S11, the carrier member 11 having a smooth surface excellent in smoothness like a polyimide (PI) film is coated with a conductive material of silver (Ag) to thereby form the seed layer 12. Meanwhile, in the seed-layer forming step S11 may form the seed layer 12 by coating the carrier member 11 with a silver (Ag) paste where nanoparticles of silver (Ag) disperse in a thermosetting rein. Meanwhile, the carrier member 11 may be made of a material that is excellent in smoothness like a nylon, a metal sheet, etc. and easily strippable from the seed layer 12 in the transfer step S14 (to be described later). In the seed-layer forming step S11, the seed layer 12 may be formed on the carrier member 11 by coating, screen-printing, sputtering, CVD, electroplating, electroless plating, or the like method.

In the placing step S12, a pair of carrier members 11 formed with the seed layers 12 as described above are respectively placed on both sides of the insulating resin layer 13, making the seed layers 12 formed on the carrier members 11 facing toward the insulating resin layer 13. Here, the insulating resin layer 13 may include a prepreg sheet given in a semi-cured state by impregnating glass epoxy with a thermosetting resin, a bonding sheet, a hot-melt thermosetting resin, etc.

In the bonding step S13, the seed layers 12 are bonded to both sides of the insulating resin layer 13 as the insulating resin layer 13 inserted between the pair of carrier members 11 is pressed in a thickness direction. In the bonding step S13, a hot-press device of providing pressure and heat at the same time may be employed. Meanwhile, according to this embodiment, it is described by way of example that the carrier members 11 are bonded to both sides of the insulating resin layer 13. As necessary, the carrier member 11 with the seed layer 12 may be bonded to only one side of the insulating resin layer 13.

In the transfer step S14, the carrier member 11 is stripped from the seed layer 12. When the carrier member 11 is removed from the seed layer 12, the seed layer 12 is transferred to the insulating resin layer 13. Meanwhile, the bonding force between the carrier member 11 and the seed layer 12 is weaker than the bonding force between the insulating resin layer 13 and the seed layer 12. Therefore, it is possible to not only easily strip the carrier member 11 from the seed layer 12 in the transfer step S14, but also prevent the seed layer 12 from being stripped from the insulating resin layer 13.

According to this embodiment as described above, a method of transferring the conductive seed layer 12 of silver (Ag) to the base material for forming the circuit is used, and the smoothness of the seed layer 12 is prevented from being lowered during a transferring process, thereby providing the seed layer 12 for a fine circuit without using an expensive copper clad film.

In particular, this embodiment is applicable to an inner layer circuit of a high multi-layered printed circuit board. Therefore, the fine structure of the inner layer circuit reduces the layers of the whole high multi-layered printed circuit board, thereby decreasing thickness and weight of an end product. As the whole layers are reduced, a cumulative defective rate is lowered.

Figure 3:
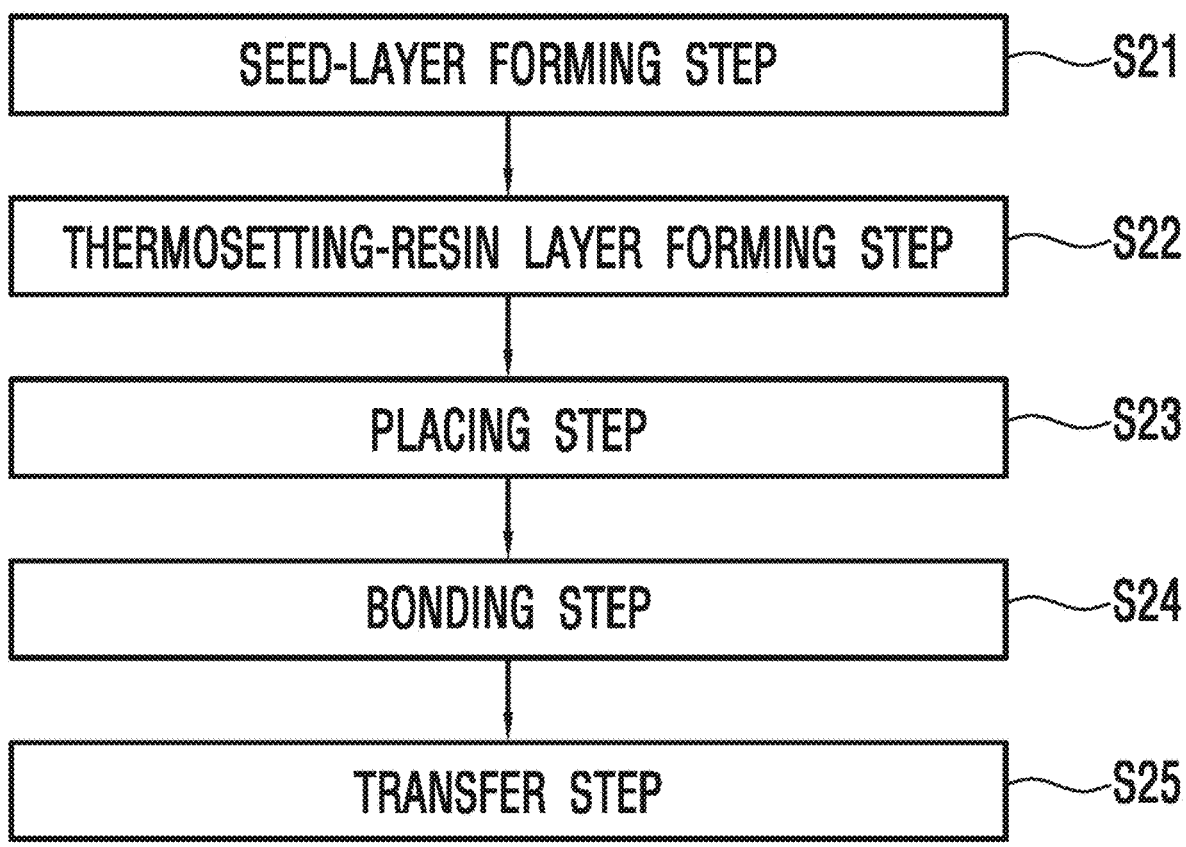
FIG. 3 is a flowchart showing a method of manufacturing a transfer film including a seed layer according to a second embodiment of the present invention.

Among the accompanying drawings, FIG. 3 is a flowchart showing a method of manufacturing a transfer film including a seed layer according to a second embodiment of the present invention, and FIG. 4 is a cross-sectional view corresponding to process steps according to the second embodiment of the present invention.

As shown in FIGS. 3 and 4, the method of manufacturing the transfer film including the seed layer according to the second embodiment of the present invention includes a seed-layer forming step S21 of forming a seed layer 12 with a conductive material on a carrier member 11; a thermosetting-resin layer forming step S22 of coating the seed layer 12 with a thermosetting resin layer 14; a placing step S23 of placing the carrier member 11 at least one side of an insulating resin layer 13; a bonding step S24 of pressing and bonding the carrier member 11 and the insulating resin layer 13; and a transfer step S25 of removing the carrier member 11 and transferring the seed layer 12 to the insulating resin layer 13.

In the seed-layer forming step S21, the carrier member 11 having a smooth surface excellent in smoothness like a polyimide (PI) film is coated with a conductive material of silver (Ag) to thereby form the seed layer 12. Meanwhile, the carrier member 11 may be made of a material that is excellent in smoothness like a nylon, a metal sheet, etc. and easily strippable from the seed layer 12 in the transfer step S25 (to be described later). In the seed-layer forming step S21, the seed layer 12 may be formed on the carrier member 11 by coating, screen-printing, sputtering, CVD, electroplating, electroless plating, or the like method.

In the thermosetting-resin layer forming step S22, the thermosetting resin layer 14 is formed by coating a hot-melt thermosetting resin on the seed layer 12.

In the placing step S23, a pair of carrier members 11 formed with the seed layers 12 and the thermosetting resin layer 14 as described above are respectively placed on both sides of the insulating resin layer 13, making the thermosetting resin layers 14 formed on the carrier members 11 facing toward the insulating resin layer 13. Here, the insulating resin layer 13 may include a prepreg sheet given in a semi-cured state by impregnating glass epoxy with a thermosetting resin.

In the bonding step S24, the thermosetting resin layers 14 are bonded to both sides of the insulating resin layer 13 as the insulating resin layer 13 inserted between the pair of carrier members 11 is pressed in a thickness direction. In the bonding step S24, a hot-press device of providing pressure and heat at the same time may be employed, and the thermosetting resin layers 14 may be cured by heat provided in the bonding step S24.

Specifically, the thermosetting resin layer 14 may be coated on the seed layer 12 while it is not cured. That is, the thermosetting resin layer 14 is adhered to the insulating resin layer 13 of prepreg while filling a rough surface of the insulating resin layer 13, and at the same time starts being cured with pressure and heat applied from the hot-press device. Thus, it is possible to prevent the smoothness of the seed layer 12 from being lowered by an uneven surface of the insulating resin layer 13 as the insulating resin layer 13 is cured.

Meanwhile, according to this embodiment, it is described by way of example that the carrier members 11 are bonded to both sides of the insulating resin layer 13. As necessary, the carrier member 11 may be bonded to one side of the insulating resin layer 13.

In addition, according to this embodiment, it is described by way of example that the thermosetting resin layer 14 is first cured to fill and smoothen the rough surface of the insulating resin layer 13. Alternatively, the insulating resin layer 13 and the thermosetting resin layer 14 to secure the smoothness of the seed layer 12, may be varied in curing order, materials, etc.

In the transfer step S25, the carrier member 11 is stripped from the seed layer 12. When the carrier member 11 is removed from the seed layer 12, the seed layer 12 is transferred to the insulating resin layer 13. Meanwhile, the bonding force between the carrier member 11 and the seed layer 12 is weaker than the bonding force between the thermosetting resin layer 14 and the seed layer 12. Therefore, it is possible to not only easily strip the carrier member 11 from the seed layer 12 in the transfer step S25, but also prevent the seed layer 12 from being stripped from the thermosetting resin layer 14.

According to this embodiment, even though inexpensive prepreg having low surface smoothness is used as the insulating resin layer 13, the thermosetting resin layer 14 is inserted as an intermediate layer, thereby preventing the surface smoothness of the seed layer 12 from being lowered. Therefore, it is possible to provide the seed layer 12 capable of actualizing a fine circuit with relatively low costs as compared with a conventional expensive copper clad film.

Among the accompanying drawings, FIG. 5 is a cross-sectional view corresponding to process steps in a method of manufacturing a circuit board by selectively etching a seed layer according to a third embodiment of the present invention, As shown in FIG. 5, the method of manufacturing the circuit board by selectively etching the seed layer according to the third embodiment of the present invention refers to a method of manufacturing a double-sided circuit board through a wet process, and includes a transfer-film preparing step S111, a carrier-member removing step S112, a first plating-layer forming step S113, a via-hole forming step S114, a current-carrying portion forming step S115, a circuit-pattern forming step, and a seed-layer etching step S120.

In the transfer-film preparing step S111, the transfer film manufactured according to the second embodiment of the present invention is prepared as shown in (a) of FIG. 5. Here, the seed layer 12 provided as a conductive material of silver (Ag) is formed on the inner side of the carrier member 11, and the thermosetting resin layer 14 is formed on the inner side of the seed layer 12. The thermosetting resin layers 14 are respectively bonded to both sides of the insulating resin layer 13 by a hot-press process. Alternatively, the transfer film manufactured according to the first embodiment of the present invention may be prepared.

In the carrier-member removing step S112, the carrier member 11 bonded to the seed layer 12 is stripped to expose the seed layer 12 as shown in (b) of FIG. 5.

In the first plating-layer forming step S113, as shown in (c) of FIG. 5, a conductive material of copper (Cu) is electroplated to form a first plating layer 15. In the via-hole forming step S114, as shown in (d) of FIG. 5, a via hole 16 is formed to penetrate from the first plating layer 15 of one side to the first plating layer 15 of the other side.

In the current-carrying portion forming step S115, as shown in (e) of FIG. 5, a conductive material of copper (Cu) is electroless-plated to form a current-carrying portion 17 on an inner wall of the via hole 16. Meanwhile, the current-carrying portion 17 may be formed by printing or coating metal ink instead of the electroless plating.

The circuit-pattern forming step includes a second plating-layer forming step S116, a pattern-layer forming step S117, and a plating-layer etching step S118, and a pattern-layer removing step S119.

In the second plating-layer forming step S116, as shown in (f) of FIG. 5, a conductive material of copper (Cu) is electroplated to additionally form a second plating layer 18 on the surfaces of the first plating layer 15 and the current-carrying portion 17.

In the pattern-layer forming step S117, as shown in (g) of FIG. 5, a photosensitive material is applied onto the second plating layer 18 and subjected to a lithography process to thereby form a pattern layer 19 through which the second plating layer 18 is selectively exposed.

In the plating-layer etching step S118, as shown in (h) of FIG. 5, the first plating layer 15 and the second plating layer 18, which are made of copper and exposed through the pattern layer 19, are etched. In the pattern-layer removing step S119, as shown in (i) of FIG. 5, the pattern layer 19 is removed.

Then, in the seed-layer etching step S120, as shown in (j) of FIG. 5, the seed layer 12 exposed through the etched portions of the first plating layer 15 and the second plating layer 18 is removed.

According to the third embodiment of the present invention, the double-sided printed circuit board having the circuit patterns on the both sides of the insulating resin layer 13 is formed by the wet process. Meanwhile, according to this embodiment, it is described by way of example that the pattern-layer removing step S119 and the seed-layer etching step S120 are performed after the plating-layer etching step S118 of FIG. 5. Alternatively, the pattern-layer removing step S119 may be omitted and the seed-layer etching step S120 may be performed after the plating-layer etching step S118 of FIG. 5.

In particular, in the seed-layer etching step S120, the seed layer exposed through the circuit pattern is removed to thereby form a circuit having a desired pattern. Here, as a method of removing the seed layer, an etching solution capable of selectively etching the seed layer of silver, a silver alloy or a silver compound is used. That is, the circuit pattern of copper is not damaged because only the seed layer of silver is selectively etched.

Figure 10:
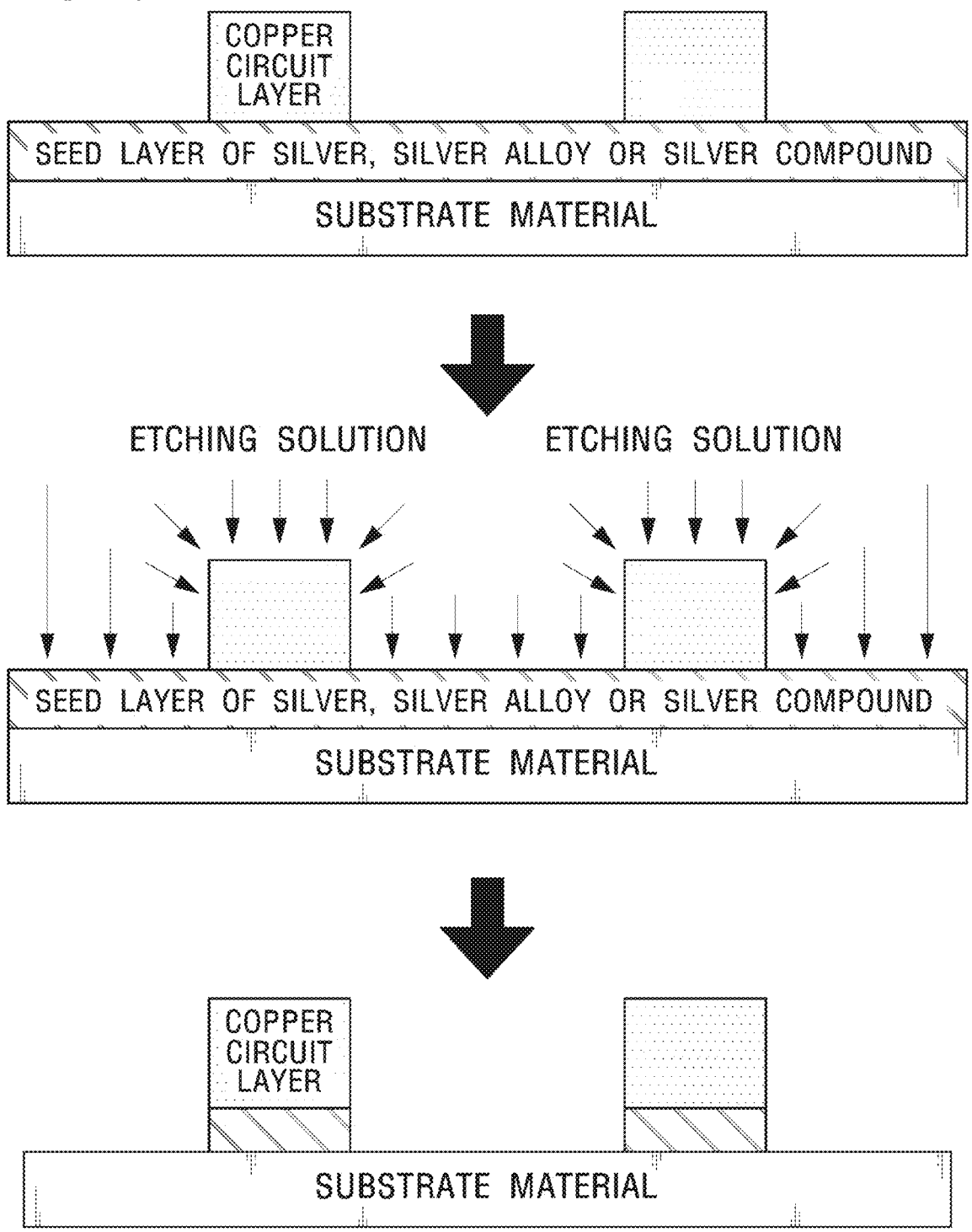
FIG. 10 is a schematic view showing a method of manufacturing a circuit board by selectively etching a seed layer according to the present invention.

In other words, a conventional problem is that the circuit is damaged by the etching solution while the seed layer is removed, because both the seed layer and the circuit are made of copper. On the other hand, according to this embodiment, the seed layer is made of silver, a silver alloy or a silver compound, and an etching solution capable of selectively etching only the seed layer is used, thereby forming a circuit board of a fine pitch without damaging the circuit when the seed layer is etched as shown in FIG. 10.

Figure 6:
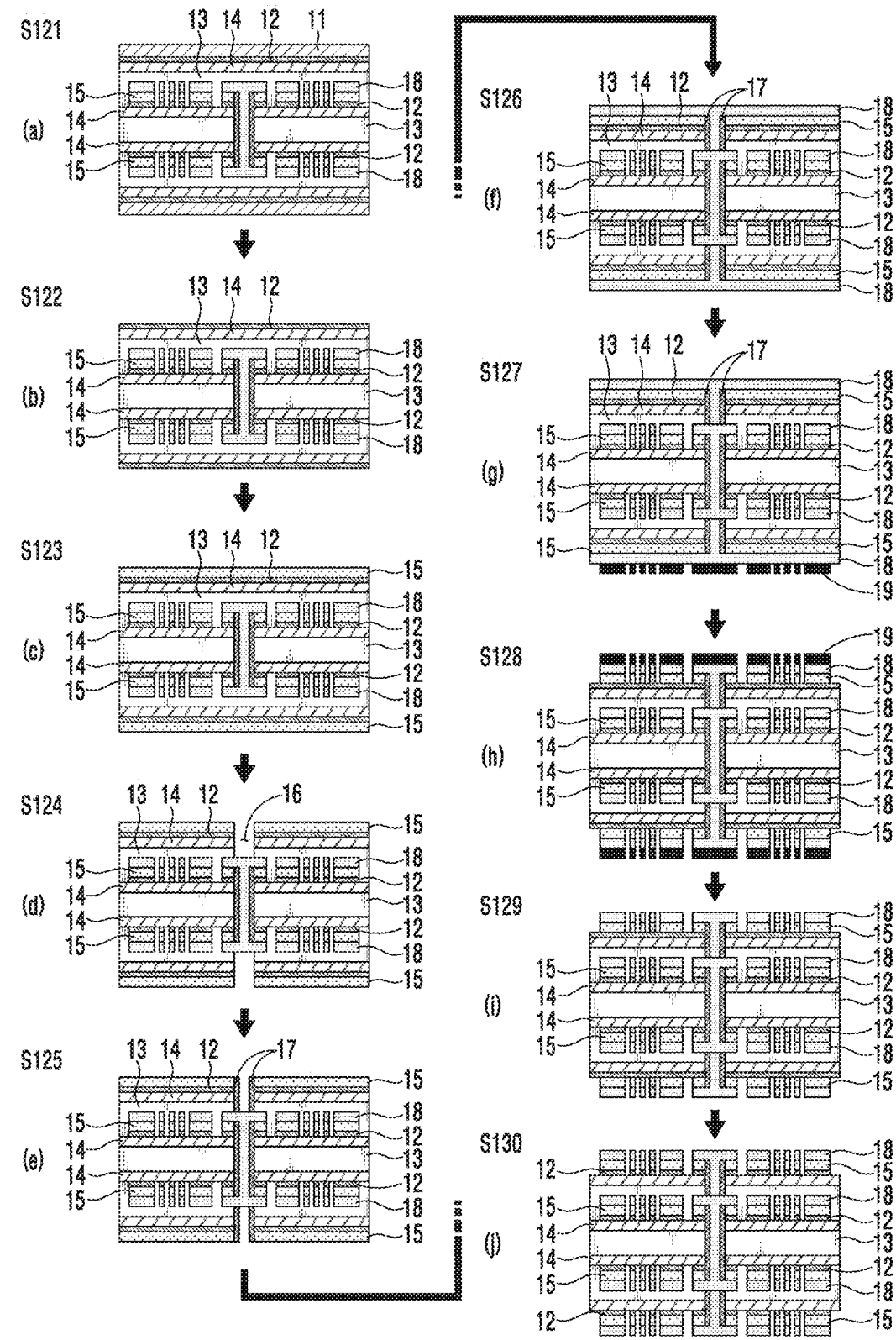
FIG. 6 is a cross-sectional view corresponding to process steps in a method of manufacturing a circuit board by selectively etching a seed layer according to a fourth embodiment of the present invention.

Among the accompanying drawings, FIG. 6 is a cross-sectional view corresponding to process steps in a method of manufacturing a circuit board by selectively etching a seed layer according to a fourth embodiment of the present invention.

As shown in FIG. 6, the method of manufacturing the circuit board by selectively etching the seed layer according to the fourth embodiment of the present invention is to form a multi-layered circuit board by additionally forming a circuit pattern on the double-sided circuit board manufactured according to the third embodiment, and additionally performs a transfer-film bonding step S121, a transfer step S122, a first plating-layer forming step S123, a via-hole forming step S124, a current-carrying portion forming step S125, a circuit-pattern forming step, and a seed-layer etching step S130 after the seed-layer etching step S120 of the third embodiment.

In the transfer-film bonding step S121, as shown in (a) of FIG. 6, the transfer films manufactured according to the present invention, in which the seed layer 12 of silver and the thermosetting resin layer 14 are bonded to one side of the carrier member 11, are disposed at both sides of the double-sided printed circuit board, and the insulating resin layer 13 is interposed between the transfer film and the double-sided circuit board. Then, a bonding process is performed using the hot-press device, and thus the seed layer 12 for forming the multi-layered circuit is additionally provided on the double-sided circuit board. The transfer film provided in the transfer-film bonding step may be given as the transfer film manufactured according to the first or second embodiment of the present invention. In this embodiment, it will be described by way of example that the transfer film manufactured according to the second embodiment is employed.

Then, in the transfer step S122, the carrier member 11 bonded to the seed layer 12 is stripped to expose the seed layer 12 as shown in (b) of FIG. 6.

In the first plating-layer forming step S123, as shown in (c) of FIG. 6, a conductive material of copper (Cu) is electroplated to form the first plating layer 15. In the via-hole forming step S124, as shown in (d) of FIG. 6, the via hole 16 is formed to expose a lower circuit pattern by penetrating the first plating layer 15, the seed layer 12, the thermosetting resin layer 14, and the insulating resin layer 13. In the current-carrying portion forming step S125, as shown in (e) of FIG. 5, a conductive material of copper (Cu) is electroless-plated to form a current-carrying portion 17 on an inner wall of the via hole 16.

In the current-carrying portion forming step S125, as shown in (e) of FIG. 6, a conductive material of copper (Cu) is electroless-plated to form a current-carrying portion 17 on an inner wall of the via hole 16.

The circuit-pattern forming step includes a second plating-layer forming step S126, a pattern-layer forming step S127, and a plating-layer etching step S128, and a pattern-layer removing step S129.

In the second plating-layer forming step S126, as shown in (f) of FIG. 6, a conductive material of copper (Cu) is electroplated to additionally form a second plating layer 18 on the surfaces of the first plating layer 15 and the current-carrying portion 17.

In the pattern-layer forming step S127, as shown in (g) of FIG. 6, a photosensitive material is applied onto the second plating layer 18 and subjected to a lithography process to thereby form a pattern layer 19 through which the second plating layer 18 is selectively exposed.

In the plating-layer etching step S128, as shown in (h) of FIG. 6, the first plating layer 15 and the second plating layer 18, which are made of copper and exposed through the pattern layer 19, are etched. In the pattern-layer removing step S129, as shown in (i) of FIG. 6, the pattern layer 19 is removed.

Then, in the seed-layer etching step S130, as shown in (j) of FIG. 6, the seed layer 12 exposed through the etched portions of the first plating layer 15 and the second plating layer 18 is removed.

According to the fourth embodiment of the present invention, it is possible to form the multi-layered printed circuit board with the multi-layered circuit pattern through the wet process.

Figure 7:
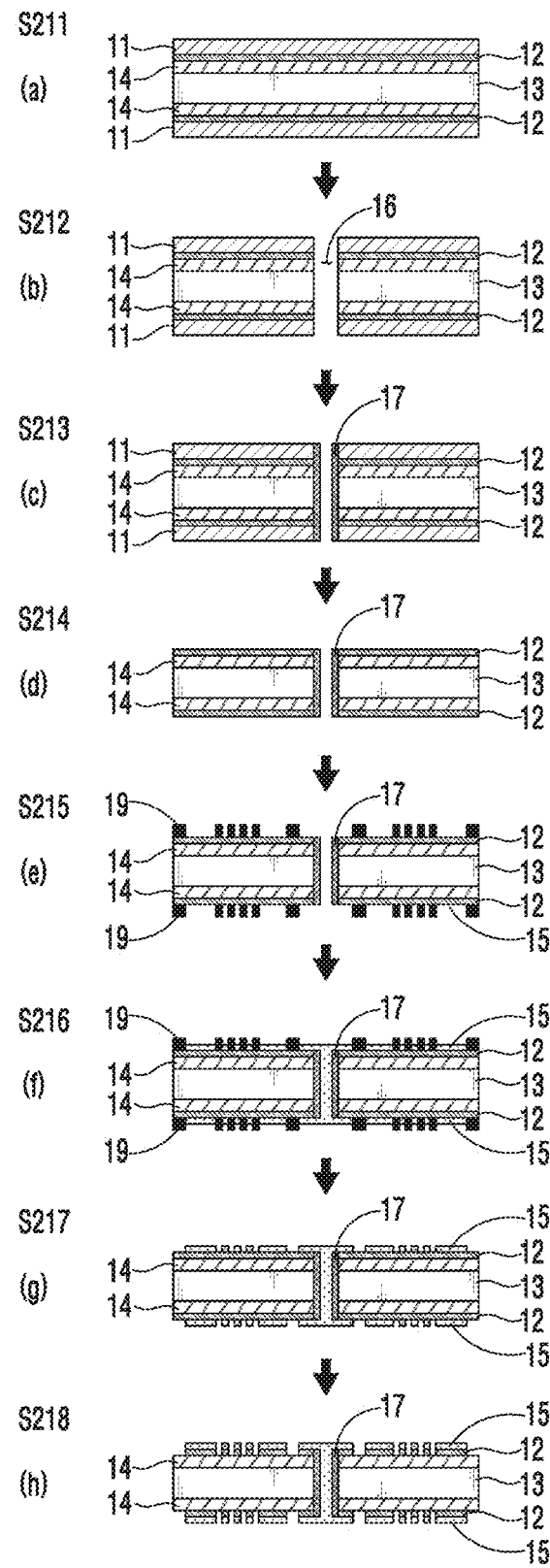
FIG. 7 is a cross-sectional view corresponding to process steps in a method of manufacturing a circuit board by selectively etching a seed layer according to a fifth embodiment of the present invention.

Among the accompanying drawings, FIG. 7 is a cross-sectional view corresponding to process steps for manufacturing a double-sided printed circuit board through a semi additive process (SAP) process using a method of manufacturing a transfer film including a seed layer according to the present invention.

Among the accompanying drawings, FIG. 7 is a cross-sectional view corresponding to process steps in a method of manufacturing a circuit board by selectively etching a seed layer according to a fifth embodiment of the present invention.

As shown in FIG. 7, the method of manufacturing the circuit board by selectively etching the seed layer according to the fifth embodiment of the present invention refers to a method of manufacturing a double-sided circuit board through the SAP, and includes a transfer-film preparing step S211, a via-hole forming step S212, a current-carrying portion forming step S213, a carrier-member removing step S214, a circuit-pattern forming step, and a seed-layer etching step S218.

In the transfer-film preparing step S211, the transfer film manufactured according to the second embodiment of the present invention is prepared as shown in (a) of FIG. 5. Here, the seed layer 12 made of a conductive material of silver (Ag) is formed on the inner side of the carrier member 11, the thermosetting resin layer 14 is formed on the inner side of the seed layer 12, and the thermosetting resin layers 14 are respectively bonded to both sides of the insulating resin layer 13 by a hot press process. Alternatively, the transfer film manufactured according to the first embodiment of the present invention may be prepared.

In the via-hole forming step S212, the via hole 16 is formed to penetrate from the carrier member 11 of one side up to the carrier member 11 of the other side as shown in (b) of FIG. 7. In the current-carrying portion forming step S213, a conductive material of copper (Cu) is electroless plated to form the current-carrying portion 17 on the inner wall of the via hole 16 as shown in (c) of FIG. 7. In the carrier-member removing step S214, the carrier member 11 bonded to the seed layer 12 is stripped to expose the seed layer 12 as shown in (d) of FIG. 7.

The circuit-pattern forming step includes a pattern-layer forming step S215, a first plating-layer forming step S216, and a pattern-layer removing step S217.

In the pattern-layer forming step S215, as shown in (e) of FIG. 7, a photosensitive material is applied onto the seed layer 12 and subjected to a lithography process to thereby form the pattern layer 19 through which the seed layer 12 is selectively exposed, so that the seed layer 12 can be selectively exposed through the pattern groove of the pattern layer 12 in accordance with a pattern desired to form a circuit. Here, the lithography process for forming the pattern groove is performed on the seed layer 12 made of silver (Ag), and the seed layer 12 made of silver (Ag) may be more improved in surface roughness than the plating layer made of copper (Cu) by plating. That is, diffuse reflection that occurs on the surface of the seed layer 12 positioned in a lower layer during the exposure process is more suppressed than that on the plating layer made of copper, and therefore it is possible to form a relatively precise pattern groove and thus have an effect on actualizing a fine circuit. In the first plating-layer forming step S216, as shown in (f) of FIG. 7, the pattern groove of the pattern layer 19 is filled with a conductive material of copper, thereby forming the first plating layer 15. Such a filling method may use an electroplating method of using the seed layer 12 as a seed. The conductive material of copper may be filled in the pattern groove because the seed layer 12 exposed through the pattern groove serves as an electrode during the plating process.

Figure 11:
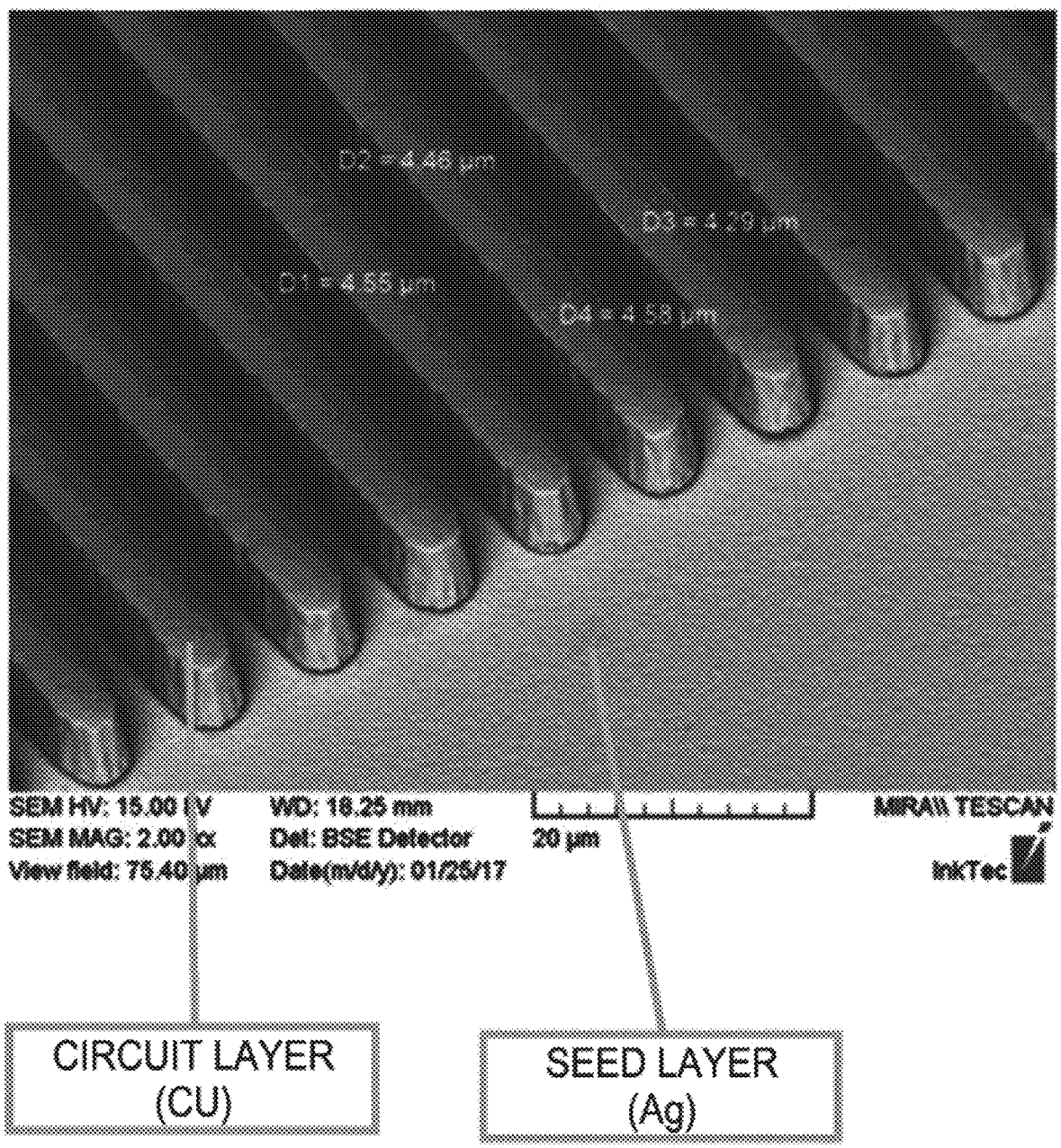
FIG. 11 is a scanning electron microscopy (SEM) picture showing a circuit formed by removing a pattern layer after a conductive material is filled by a method of forming a circuit board according to the present invention.

In the pattern-layer removing step S217, the pattern layer 19 is removed as shown in (g) of FIG. 7. FIG. 11 is a scanning electron microscopy (SEM) picture showing that the pattern layer 19 is removed in the pattern-layer removing step S217.

Figure 12:
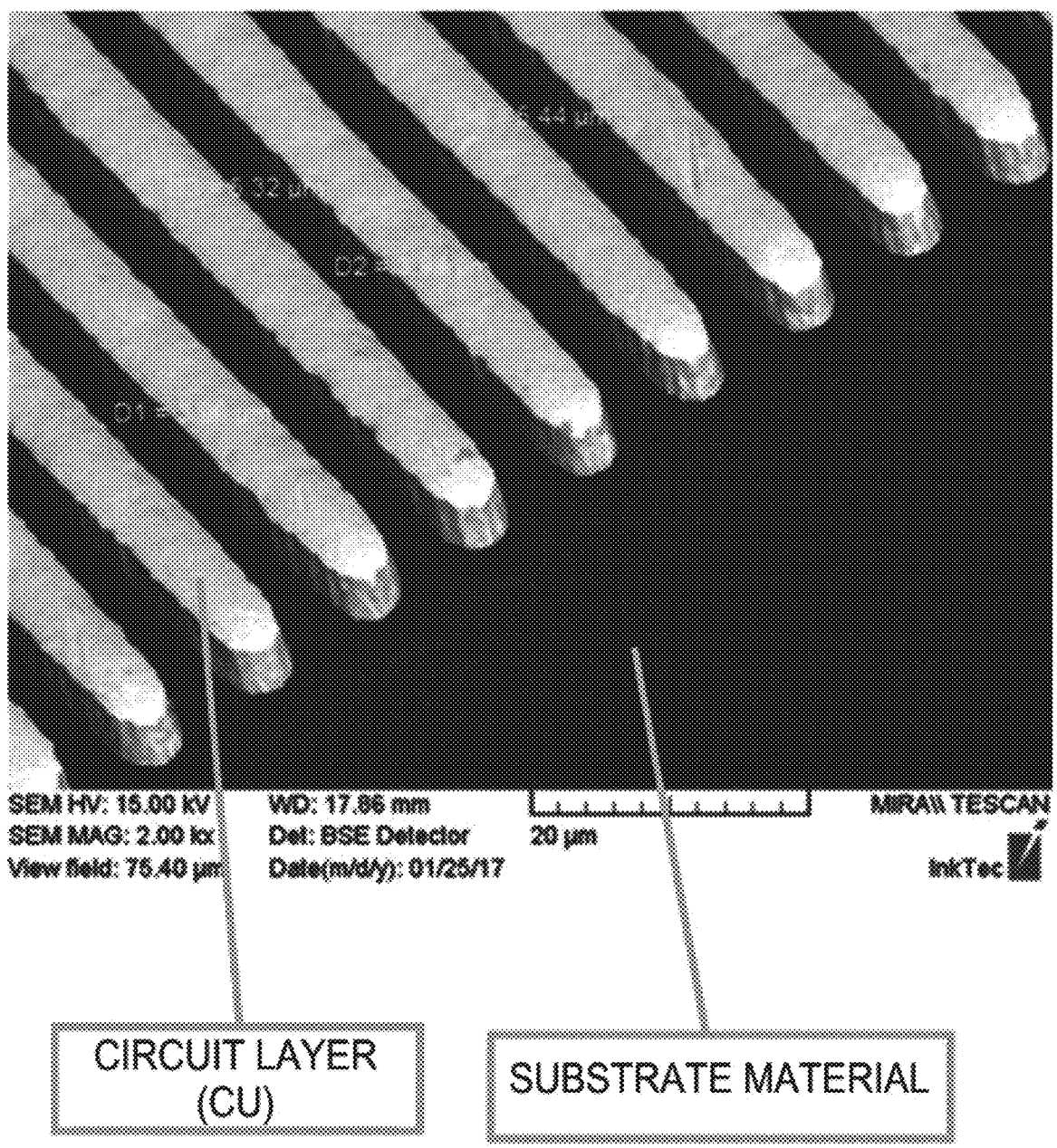
FIG. 12 is an SEM picture showing a circuit formed by selectively etching only a seed layer of silver with an etching solution composition according to the present invention.

Then, in the seed-layer etching step S218, as shown in (h) of FIG. 7, the seed layer 12 of silver (Ag) exposed through the pattern layer 19 is removed by a selective etching solution. Here, to remove the seed layer, the etching solution capable of selectively etching only the seed layer of silver, a silver alloy or a silver compound is used. That is, only the seed layer 12 of silver is selectively etched, and therefore the circuit pattern of copper is not damaged. FIG. 12 is an SEM picture showing that the seed layer 12 is removed in the seed-layer etching step S218.

According to the fifth embodiment of the present invention, it is possible to form the double-sided circuit board in which a fine circuit patterns are formed on both sides of the insulating resin layer 13 by the SAP.

Figure 8:
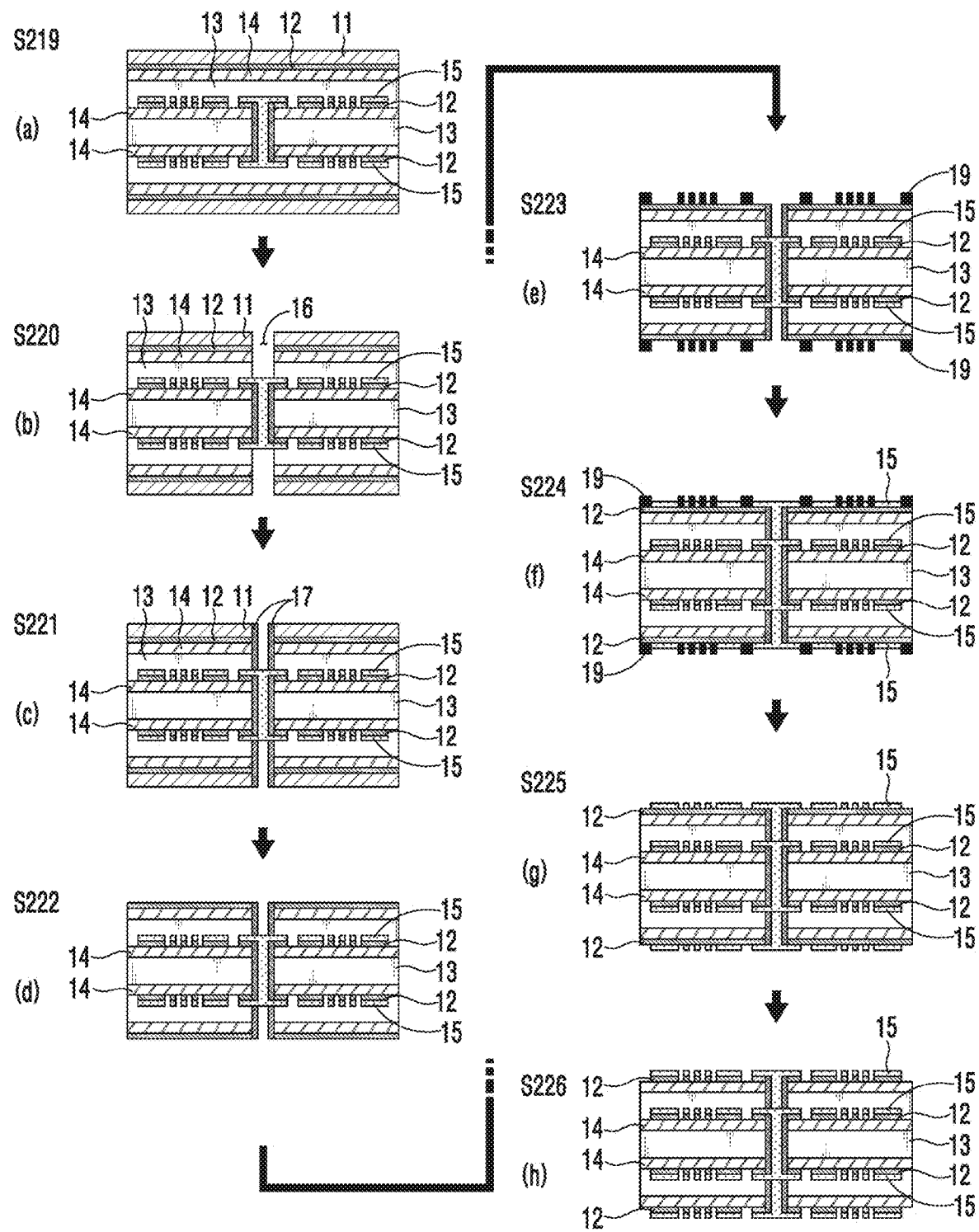
FIG. 8 is a cross-sectional view corresponding to process steps in a method of manufacturing a circuit board by selectively etching a seed layer according to a sixth embodiment of the present invention.
Figure 9:
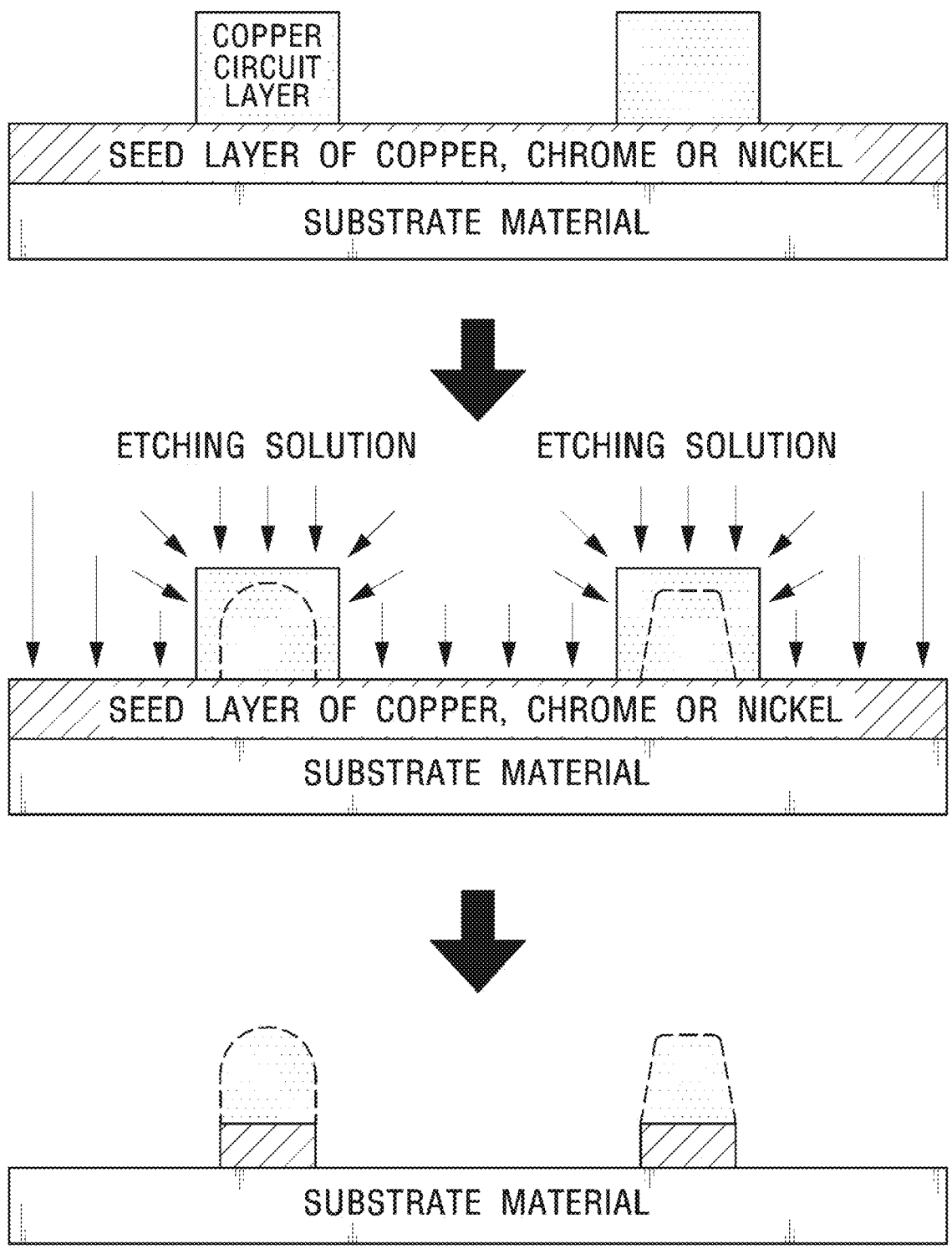
FIG. 9 is a schematic view showing a method of forming a circuit based on a conventional substrate material and a conventional etching solution composition.

Among the accompanying drawings, FIG. 8 is a cross-sectional view corresponding to process steps in a method of manufacturing a circuit board by selectively etching a seed layer according to a sixth embodiment of the present invention.

As shown in FIG. 8, the method of manufacturing the circuit board by selectively etching the seed layer according to the sixth embodiment of the present invention is to manufacture a multi-layered circuit board by additionally forming a circuit pattern on the double-sided circuit board manufactured according to the fifth embodiment, and additionally performs a transfer-film bonding step S219, a via-hole forming step S220, a current-carrying portion forming step S221, a transfer step S222, a circuit-pattern forming step, and a seed-layer etching step S226 after the seed-layer etching step S218 of the fifth embodiment. In the transfer-film bonding step S219, as shown in (a) of FIG. 8, the transfer films manufactured according to the present invention, in which the seed layer 12 and the thermosetting resin layer 14 are bonded to one side of the carrier member 11, are disposed at both sides of the double-sided printed circuit board, and the insulating resin layer 13 is interposed between the transfer film and the double-sided printed circuit board and then subjected to a bonding process using the hot-press device. With this transfer film bonding step, the seed layer 12 for forming the multi-layered circuit may be additionally provided on the double-sided circuit board.

In the via-hole forming step S220, as shown in (b) of FIG. 8, the carrier member 11, the seed layer 12, the thermosetting resin layer 14, and the insulating resin layer 13 are penetrated to form the via hole 16 through which the lower first plating layer 15 is exposed.

In the current-carrying portion forming step S221, as shown in (C) of FIG. 8, the conductive material of copper (Cu) is electroless plated to form the current-carrying portion 17 on the inner wall of the via hole 16.

In the transfer step S222, as shown in (d) of FIG. 8, the carrier member 11 bonded to the seed layer 12 is stripped to expose the seed layer 12.

The circuit-pattern forming step includes a pattern-layer forming step S223, a first plating-layer forming step S224, and a pattern-layer removing step S225.

In the pattern-layer forming step S215, as shown in (e) of FIG. 8, a photosensitive material is applied onto the seed layer and then subjected to a lithography process to form the pattern layer 19 through which the seed layer 12 is selectively exposed. Thus, the seed layer 12 is selectively exposed through the pattern groove of the pattern layer 19 in accordance with a pattern desired to form the circuit. Here, the lithography process for forming the pattern groove is performed on the seed layer 12 made of silver (Ag), and the seed layer 12 made of silver (Ag) may be more improved in surface roughness than the plating layer made of copper (Cu) by plating. That is, diffuse reflection that occurs on the surface of the seed layer 12 positioned in a lower layer during the exposure process is more suppressed than that on the plating layer made of copper, and therefore it is possible to form a relatively precise pattern groove and thus have an effect on actualizing a fine circuit.

In the first plating-layer forming step S216, as shown in (f) of FIG. 8, the pattern groove of the pattern layer 19 is filled with a conductive material of copper, thereby additionally forming the first plating layer 15. Such a filling method may use an electroplating method of using the seed layer 12 as a seed. The conductive material of copper may be filled in the pattern groove because the seed layer 12 exposed through the pattern groove serves as an electrode during the plating process.

In the pattern-layer removing step S217, the pattern layer 19 is removed as shown in (g) of FIG. 8.

In the seed-layer etching step S226, as shown in (h) of FIG. 8, the seed layer 12 of silver (Ag) exposed through the pattern layer 19 is selectively removed by the etching solution.

According to the sixth embodiment of the present invention, it is possible to form the multi-layered circuit board with the multi-layered circuit pattern through the SAP.

Further, as described above, the present invention relates to an etching solution composition for selectively etching only silver, a silver alloy or a silver compound.

The seed layer refers to a thin film including silver, a silver alloy or a silver compound, and the seed-layer forming process may include sputtering, CVD, electroless plating, coating, and dipping processes, and any universal process capable of forming metal, a metal alloy, or a metal compound. However, there are no specific limits to the seed-layer forming process.

Below, a selective etching solution composition for silver, a silver alloy or a silver compound of the present invention will be described.

As the selective etching solution composition according to the present invention, there may be used an etching solution composition that contains an ammonium compound and an oxidizing agent, disclosed in Korean Patent No. 10-0712879 owned by the present applicant; or a selective etching solution composition that contains oxidative gas, peroxides, peroxy acid, or the like oxidizing agent, aliphatic amine or aromatic amine or alkanol amine or an ammonium compound, a chelate agent, defoamer, humectant, pH regulator and one or more other additives selected for improving etching performance of the etching solution, and water. Each composition of the selective etching solutions will be described below in detail.

The oxidizing agent contained in the etching solution composition for silver, a silver alloy or a silver compound serves to oxidize silver on the surface of the seed layer. The related art has disclosed the etching solution composition or the like using nitric acid, hydrochloric acid, sulfuric acid, phosphoric acid, iron nitrate, iron chloride, iron sulfate, iron phosphate, etc. However, such etching solution compositions refer to materials for oxidizing and dissociating copper, nickel, chrome or the like metal, and are not suitable to be used as a circuit etching solution for selectively etching only silver.

The oxidizing agent includes air, oxygen, ozone or the like oxidative gas, sodium perborate, hydrogen peroxide, sodium bismuthate, sodium percarbonate, benzoyl peroxide, potassium peroxide, sodium peroxide or the like peroxides, formic acid, peroxyacetic acid, perbenzoic acid, 3-chloroperoxybenzoic acid, trimethylacetic acid or the like peroxy acid, and potassium persulfate. The oxidizing agent may be used mixing with at least one oxidizing agent.

With respect to the total weight of the etching solution composition of silver, a silver alloy or a silver compound, 1 to 30 wt %, more preferably, 5 to 18 wt % of oxidizing agent may be included. The oxidizing agent lower than 1 wt % makes etching speed be low and etching be incompletely performed, thereby producing a lot of silver residue. The silver residue may be present between a circuit and a circuit and cause a short-circuit, thereby causing a defective product. Further, productivity is adversely affected by the low etching speed. On the other hand, the oxidizing agent more than 30 wt % makes the exposed seed layer 2 be fast etched, but affects the seed layer 2 present under the circuit layer, thereby causing an excessive under-cut. Such an under-cut phenomenon has an adverse effect on the adhesion of the circuit layer, and thus needs to be suppressed.

Aliphatic amine or aromatic amine or alkanol amine or ammonium compound contained in the etching solution composition for silver, a silver alloy or a silver compound of the present invention serves to dissociate silver oxidized in the seed layer. By oxidation based on the oxidizing agent and dissociation based on aliphatic or aromatic amine, it is possible to selectively etch only silver, a silver alloy or a silver compound. As described above, nitric acid, hydrochloric acid, sulfuric acid, phosphoric acid, iron nitrate, iron hydrochloride, iron sulfate, iron phosphate, etc. included in the conventional etching solution composition cause both oxidation and dissociation because one material serves as a main etching agent to react with copper. However, in the etching solution according to the present invention, two materials are respectively in charge of the oxidation and the dissociation, and the aliphatic or aromatic amine or alkanol amine or the ammonium compound has a more violent dissociation reaction with oxidized silver than with copper, thereby selectively etching only the seed layer made of silver, a silver alloy or a silver compound.

The aliphatic or aromatic amine or alkanol amine or the ammonium compound may use ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, ethanolamine, 6-amino-2-methyl-2-heptanol, 1-amino-2-propanol, methanolamine, dimethylethanolamine, N-methylethanolamine, 1-aminoethanol, 2-amino-2-methyl-1-propanol, ammonium carbonate, ammonium phosphate, ammonium nitrate, ammonium fluoride, ammonium hydroxide, or the like amines or ammonium compound. When such amines or ammonium compound is used, at least one of the amines or the ammonium compound may be mixed.

With respect to the total weight of the etching solution composition for the seed layer 2 made of silver, 1 to 75 wt %, more preferably, 20 to 70 wt % of aliphatic or aromatic amine or alkanol amine or the ammonium compound may be included. The aliphatic or aromatic amine or alkanol amine or the ammonium compound lower than 1 wt % makes a dissociation reaction with oxidized silver be inactive, thereby lowering the speed of etching the silver seed layer. On the other hand, the aliphatic or aromatic amine or alkanol amine or the ammonium compound more than 75 wt % has no problem in selectively etching the seed layer, but excessive use of the amines or the ammonium compound hinders the oxidizing agent in the etching solution from oxidizing silver, a sliver alloy or a silver compound and thus lowers the selective-etching speed. Therefore, the amines or the ammonium compound is used enough to cause a surface oxidation reaction of the seed layer and dissolve oxidized silver to make selective etching smooth.

The chelate agent, defoamer, humectant, pH regulator and one or more other additives selected for improving etching performance of the etching solution, which are included in the etching solution composition for silver, a silver alloy or a silver compound according to the present invention, serve to remove bubbles that may be generated in the oxidation reaction, give wetting properties so that the etching solution can be well absorbed onto the surface of the seed layer, and so on. Besides, general purpose additives may be selected and used to increase the effects of the present invention.

With respect to the total weight of the etching solution composition for the silver seed layer 2, each of the additives may be included by 0.1 to 10 wt %, more preferably, 1-7 wt % according to the kinds and purposes thereof. The additives less than 0.1 wt % cannot carry out their own roles of improving the effects of the present invention, i.e. the selective etching characteristic. The additives more than 10 wt % gelatinize the etching solution, thereby largely degrading the etching characteristics.

A remainder of a total 100 wt % etching solution composition for silver, a silver alloy or a silver compound according to the present invention except the foregoing materials is water.

Deionized water may be used for this water.

Hereinafter, embodiments of the present invention will be described in more detail. However, the embodiments are merely examples of the present invention, and do not limit the scope of the present invention.

Embodiment 1: Preparation of Selective Etching Solution Composition 1-1: Preparation of Selective Etching Solution Composition 1

Hydrogen peroxide 12 wt %, monoethanolamine 40 wt %, wetting agent 1 wt %, antifoaming agent 1 wt %, and deionized (DI) water wt % were mixed to prepare a selective etching solution composition 1.

1-2: Preparation of Selective Etching Solution Composition 2

Sodium percarbonate 7 wt %, N-methyldiethnaolamine 32.5 wt %, wetting agent 0.5 wt %, antifoaming agent 1 wt %, and DI water 59 wt % were mixed to prepare a selective etching solution composition 2.

1-3: Preparation of Selective Etching Solution Composition 3

Sodium percarbonate 4 wt %, N-methyldiethnaolamine 60 wt %, wetting agent 1.5 wt %, antifoaming agent 0.5 wt %, and DI water wt % were mixed to prepare a selective etching solution composition 3.

Embodiment 2: Preparation of Comparative Examples 2-1: Preparation of Comparative Example 1

For comparison with the selective etching solution compositions 1 to 3 prepared in the embodiment 1, with reference to the embodiment 1 disclosed in Korean Patent Publication No. 10-2016-0115189, iron (III) 10 wt %, nitric acid 5 wt %, acetic acid 5 wt %, EDTA 1 wt %, glycolic acid 1 wt %, and DI water 78 wt % were mixed to prepare a comparative example 1.

2-2: Preparation of Comparative Example 2

For comparison with the selective etching solution compositions 1 to 3 prepared in the embodiment 1, with reference to the embodiment 1 disclosed in Korean Patent Publication No. 10-2010-0098409, ammonia 7 wt %, hydrogen peroxide 1.5 wt %, and DI water 91.5 wt % were mixed to prepare a comparative example 2.

2-3: Preparation of Comparative Example 3

For comparison with the selective etching solution compositions 1 to 3 prepared in the embodiment 1, with reference to the comparative embodiment 2 disclosed in Korean Patent Publication No. 10-2010-0098409, phosphoric acid 50 wt %, nitric acid 5 wt %, acetic acid 30 wt %, and DI water 15 wt % were mixed to prepare a comparative example 3.

Embodiment 3: Etching Test Results

Under test conditions such as a substrate material of polyimide (PI), a specimen size of 2.5×2.5 cm (Ag coating seed layer, Cu-flexible copper clad laminate (FCCL)), an etching solution of 40 g, an etching time of 10 seconds, and an inductively coupled plasma (ICP) analysis of regarding less than 5 ppm as not detected (N.D), the selective etching solution composition prepared in the embodiment 1 and the comparative example prepared in the embodiment 2 were subjected to an etching test (see FIG. 13).

As a result, with the selective etching solution compositions 1 to 3 and for the etching time of 10 seconds, silver was etched to expose the surface of the PI substrate material. However, the surface of the Cu FCCL did not have any specific discoloration or anything significant, and therefore it was appreciated that the etching solution made no surface oxidation.

On the other hand, with the comparative examples 1 and 2 and for the same period of time, silver was not etched by 100% leaving a residue, and the surface of the Cu FCCL was oxidized and discolored. Further, with the comparative example 3 and for the same period of time, silver was etched by 100%, but the surface of the Cu FCCL was quickly etched and rapidly oxidized.

Silver and copper detected in the etching solution by the ICP analysis are as follows. In the comparative examples 1 and 2 with which silver was not etched by 100%, silver less than 170 ppm was detected. In the comparative examples 1 to 3 with which the surface of the Cu FCCL was oxidized and discolored, copper was detected. In particular, the comparative example 1 and 3 with which silver was much etched, copper was also quickly etched and thus much detected.

In conclusion, unlike the comparative examples 1 to 3, the selective etching solution compositions 1 to 3 made silver be etched 100%, i.e. more than 170 ppm for the etching time of 10 seconds, and copper be not detected, i.e. N.D (detected as much as less than 5 ppm). Therefore, it was understood that the selective etching solution compositions 1 to 3 selectively etched only silver.

The scope of the present invention is not limited to the foregoing embodiments, and may be varied depending on various embodiments within the appended claims. It will be appreciated by anyone who has an ordinary skill in the art to which the present invention pertains that various changes can be made without departing from the concept claimed in the appended claims.

| Reference Numerals | |
|---|---|
| 11: carrier member, | 12: seed layer, |
| 13: insulating resin layer, | 14: thermosetting resin layer, |
| 15: first plating layer, | 16: via hole, |
| 17: current carrying portion, | 18: second plating layer, |
| 19: pattern layer | |

What is claimed is:

1. A method of manufacturing a circuit board by selectively etching a seed layer, the method comprising:
   a transfer-film preparing step of preparing a transfer film in which a seed layer of silver (Ag) and a carrier member are stacked on an insulating resin layer;
   a carrier-member removing step of stripping the carrier member from the transfer film to expose the seed layer;
   a circuit-pattern forming step of forming a circuit pattern of copper (Cu) on the seed layer; and
   a seed-layer etching step of removing the seed layer exposed through the circuit pattern,
      wherein a thermosetting resin layer is interposed between the insulating resin layer and the seed layer of silver,
      wherein the thermosetting resin layer is applied as uncured onto the seed layer without being cured, and then cured in the bonding step of pressing and bonding the seed layer and the insulating resin layer in a thickness direction,
      wherein the seed-layer etching step comprises using a selective etching solution capable of dissolving only the seed layer of silver to selectively remove the seed layer,
      wherein the selective etching solution comprises an oxidizing agent; amines compound; an additive; and water,
      wherein the amines compound comprises one or more selected from a group consisting of ethylamine, propylamine, isopropyl amine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethnaolamine, 1-aminoethanol, 2-amino-2-methyl-1-propanol.

2. The method according to claim 1, further comprising, after the carrier-member removing step:
   a first plating-layer forming step of forming a first plating layer of copper (Cu) on a seed layer formed on each side of the insulating resin layer;
   a via-hole forming step of forming a via hole to penetrate from the first plating layer of one side to the first plating layer of the other side; and
   a current-carrying portion forming step of forming a current carrying portion of copper on an inner wall of the via hole.

3. The method according to claim 1, further comprising, after the seed-layer etching step:
   a transfer-film bonding step of disposing the insulating resin layer and the carrier member formed with the seed layer of silver (Ag) in sequence on the circuit pattern, and pressing and bonding the seed layer and the insulating resin layer in a thickness direction;
   a transfer step of removing the carrier member to transfer the seed layer to the insulating resin layer; and
   a circuit-pattern forming step of forming a circuit pattern of copper (Cu) on the seed layer.

4. The method according to claim 3, further comprising, after the transfer step:
   a first plating-layer forming step of forming a first plating layer of copper (Cu) on the seed layer;
   a via-hole forming step of forming a via hole to penetrate the first plating layer, the seed layer, and the insulating resin layer and expose a circuit pattern beneath the insulating resin layer; and
   a current-carrying portion forming step of forming a current carrying portion of copper on an inner wall of the via hole.

5. The method according to claim 4, wherein the circuit-pattern forming step comprises:
   a second plating-layer forming step of forming a second plating layer of copper on surfaces of the first plating layer and the current carrying portion;
   a pattern-layer forming step of forming a pattern layer on the second plating layer to selectively expose the second plating layer;
   a plating-layer etching step of forming a circuit pattern by etching the first and second plating layers of copper exposed through the pattern layer; and
   a pattern-layer removing step of removing the pattern layer.

6. The method according to claim 2, wherein the circuit-pattern forming step comprises:
   a second plating-layer forming step of forming a second plating layer of copper on surfaces of the first plating layer and the current carrying portion;
   a pattern-layer forming step of forming a pattern layer on the second plating layer to selectively expose the second plating layer;
   a plating-layer etching step of forming a circuit pattern by etching the first and second plating layers of copper exposed through the pattern layer; and
   a pattern-layer removing step of removing the pattern layer.

7. A method of manufacturing a circuit board by selectively etching a seed layer, the method comprising:
   a transfer-film preparing step of preparing a transfer film in which a seed layer of silver and a carrier member are stacked on each side of an insulating resin layer;
   a carrier-member removing step of stripping the carrier member from the transfer film to expose the seed layer;
   a circuit-pattern forming step of forming a circuit pattern of copper on the seed layer; and
   a seed-layer etching step of removing the seed layer exposed through the circuit pattern,
      wherein a thermosetting resin layer is interposed between the insulating resin layer and the seed layer of silver,
      wherein the thermosetting resin layer is applied as uncured onto the seed layer without being cured, and then cured in the bonding step of pressing and bonding the seed layer and the insulating resin layer in a thickness direction,
      wherein the seed-layer etching step comprises using a selective etching solution capable of dissolving only the seed layer of silver to selectively remove the seed layer,
      wherein the selective etching solution comprises an oxidizing agent; amines compound; an additive; and water,
      wherein the amines compound comprises one or more selected from a group consisting of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanol amine, 6-amino-2-methyl-2-heptanol, 1-amino-2-propanol, methanolamine, dimethylethanolamine, N-methyldiethnaolamine, 1-aminoethanol, 2-amino-2-methyl-1-propanol.

8. The method according to claim 7, further comprising, after the transfer-film preparing step:
   a via-hole forming step of forming a via hole to penetrate the transfer film in a thickness direction; and
   a current-carrying portion forming step of forming a current carrying portion of copper on an inner wall of the via hole.

9. The method according to claim 8, further comprising, after the seed-layer etching step:
   a bonding step of disposing the insulating resin layer and the carrier member formed with the seed layer of silver (Ag) in sequence on the circuit pattern, and pressing and bonding the seed layer and the insulating resin layer in a thickness direction; and
   a transfer step of removing the carrier member to transfer the seed layer to the insulating resin layer.

10. The method according to claim 9, further comprising, after the transfer step, a circuit-pattern forming step of forming a circuit pattern of copper (Cu) on the seed layer.

11. The method according to claim 9, further comprising, after the bonding step:
    a via-hole forming step of forming a via hole to penetrate the carrier member, the seed layer, and the insulating resin layer and expose the circuit pattern beneath the insulating resin layer; and
    a current-carrying portion forming step of forming a current carrying portion of copper on an inner wall of the via hole.

12. The method according to claim 7, wherein the circuit-pattern forming step comprises:
    a pattern-layer forming step of forming a pattern layer on the seed layer to selectively expose the seed layer;
    a first plating-layer forming step of forming a first plating layer of copper on surfaces of the seed layer and the current carrying portion exposed through the pattern layer; and
    a pattern-layer removing step of removing the pattern layer.

13. The method according to claim 7, wherein the selective etching solution comprises 1 to 30 wt % of oxidizing agent, 1 to 75 wt % of amine or ammonium compound, 0.1 to 10 wt % of additive, and a remaining wt % of water with respect to a total 100 wt % of the selective etching solution.

14. The method according to claim 7, wherein the oxidizing agent comprises one or more selected from a group consisting of oxidative gas, peroxides, peroxy acid, and potassium persulfate.

15. The method according to claim 14, wherein
    the oxidative gas comprises one or more selected from a group consisting of air, oxygen, and ozone;
    the peroxide comprises one or more selected from a group consisting of sodium perborate, hydrogen peroxide, sodium bismuthate, sodium percarbonate, benzoyl peroxide, potassium peroxide, and sodium peroxide; and
    the peroxy acid comprises one or more selected from a group consisting of formic acid, peroxyacetic acid, perbenzoic acid, 3-chloroperoxybenzoic acid, and trimethylacetic acid.

16. The method according to claim 7, wherein the additive comprises one or more selected from a group consisting of a chelate agent, an antifoaming agent, a wetting agent, and a pH regulator.

17. The method according to claim 10, wherein the circuit-pattern forming step comprises:
    a pattern-layer forming step of forming a pattern layer on the seed layer to selectively expose the seed layer;
    a first plating-layer forming step of forming a first plating layer of copper on surfaces of the seed layer and the current carrying portion exposed through the pattern layer; and
    a pattern-layer removing step of removing the pattern layer.

18. The method according to claim 7, wherein the selective etching solution comprises an oxidizing agent; amines or an ammonium compound; an additive; and water.

19. The method according to claim 7, wherein the selective etching solution comprises 1 to 30 wt % of oxidizing agent, 1 to 75 wt % of amine or ammonium compound, 0.1 to 10 wt % of additive, and a remaining wt % of water with respect to a total 100 wt % of the selective etching solution.

20. The method according to claim 18, wherein the oxidizing agent comprises one or more selected from a group consisting of oxidative gas, peroxides, peroxy acid, and potassium persulfate.

21. The method according to claim 20, wherein
    the oxidative gas comprises one or more selected from a group consisting of air, oxygen, and ozone;
    the peroxide comprises one or more selected from a group consisting of sodium perborate, hydrogen peroxide, sodium bismuthate, sodium percarbonate, benzoyl peroxide, potassium peroxide, and sodium peroxide; and
    the peroxy acid comprises one or more selected from a group consisting of formic acid, peroxyacetic acid, perbenzoic acid, 3-chloroperoxybenzoic acid, and trimethylacetic acid.

22. The method according to claim 18, wherein the amines comprise one or more selected from a group consisting of an aliphatic amine, an aromatic amine, and an alkanol amine.

23. The method according to claim 18, wherein the amines or ammonium compound comprises one or more selected from a group consisting of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanol amine, 6-amino-2-methyl-2-heptanol, 1-amino-2-propanol, methanolamine, dimethylethanol amine, N-methyldiethnaolamine, 1-aminoethanol, 2-amino-2-methyl-1-propanol, ammonium carbonate, ammonium phosphate, ammonium nitrate, ammonium fluoride, and ammonium hydroxide.

24. The method according to claim 18, wherein the additive comprises one or more selected from a group consisting of a chelate agent, an antifoaming agent, a wetting agent, and a pH regulator.

25. An etching solution composition for selectively etching the seed layer of silver according to claim 7, comprising an oxidizing agent; amines or an ammonium compound; an additive; and water.

26. The etching solution according to claim 25, wherein the selective etching solution composition comprises 1 to 30 wt % of oxidizing agent, 1 to 75 wt % of amine or ammonium compound, 0.1 to 10 wt % of additive, and a remaining wt % of water with respect to a total 100 wt % of the selective etching solution.

27. The etching solution according to claim 25, wherein the oxidizing agent comprises one or more selected from a group consisting of oxidative gas, peroxides, peroxy acid, and potassium persulfate.

28. The etching solution according to claim 27, wherein the oxidative gas comprises one or more selected from a group consisting of air, oxygen, and ozone;
the peroxide comprises one or more selected from a group consisting of sodium perborate, hydrogen peroxide, sodium bismuthate, sodium percarbonate, benzoyl peroxide, potassium peroxide, and sodium peroxide; and
the peroxy acid comprises one or more selected from a group consisting of formic acid, peroxyacetic acid, perbenzoic acid, 3-chloroperoxybenzoic acid, and trimethylacetic acid.

29. The etching solution according to claim 25, wherein the amines comprise one or more selected from a group consisting of an aliphatic amine, an aromatic amine, and an alkanol amine.

30. The etching solution according to claim 25, wherein the amines or ammonium compound comprises one or more selected from a group consisting of ethylamine, propyl amine, isopropylamine, n-butylamine, isobutylamine, sec-butylamine, diethylamine, piperidine, tyramine, N-methyl-tyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethnaolamine, 1-aminoethanol, 2-amino-2-methyl-1-propanol, ammonium carbonate, ammonium phosphate, ammonium nitrate, ammonium fluoride, and ammonium hydroxide.

31. The etching solution according to claim 25, wherein the additive comprises one or more selected from a group consisting of a chelate agent, an antifoaming agent, a wetting agent, and a pH regulator.

* * * * *

UNITED STATES PATENT AND TRADEMARK OFFICE
CERTIFICATE OF CORRECTION

| | | |
|---|---|---|
| PATENT NO. | : 11,453,823 B2 | Page 1 of 1 |
| APPLICATION NO. | : 16/487104 | |
| DATED | : September 27, 2022 | |
| INVENTOR(S) | : Kwang-Choon Chung et al. | |

It is certified that error appears in the above-identified patent and that said Letters Patent is hereby corrected as shown below:

On the Title Page

In item (73) Assignee:
"InkTee Co., Ltd." should be changed to -- InkTec Co., Ltd. --

Signed and Sealed this
Tenth Day of January, 2023

Katherine Kelly Vidal
*Director of the United States Patent and Trademark Office*